US009406568B2

(12) United States Patent
Ok et al.

(10) Patent No.: US 9,406,568 B2
(45) Date of Patent: Aug. 2, 2016

(54) SEMICONDUCTOR STRUCTURE CONTAINING LOW-RESISTANCE SOURCE AND DRAIN CONTACTS

(71) Applicant: International Business Machines Corporation, Armonk, NY (US)

(72) Inventors: Injo Ok, Loudonville, NY (US); Balasubramanian Pranatharthiharan, Watervliet, NY (US); Charan Veera Venkata Satya Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/550,409

(22) Filed: Nov. 21, 2014

(65) Prior Publication Data

US 2016/0148846 A1    May 26, 2016

(51) Int. Cl.
| | |
|---|---|
| *H01L 21/336* | (2006.01) |
| *H01L 21/8238* | (2006.01) |
| *H01L 21/28* | (2006.01) |
| *H01L 21/283* | (2006.01) |
| *H01L 27/092* | (2006.01) |
| *H01L 29/66* | (2006.01) |

(52) U.S. Cl.
CPC ...... *H01L 21/823828* (2013.01); *H01L 21/283* (2013.01); *H01L 21/28008* (2013.01); *H01L 27/0922* (2013.01); *H01L 29/66545* (2013.01)

(58) Field of Classification Search
CPC .................. H01L 29/7838; H01L 29/7839
USPC .................................................. 438/300, 279
See application file for complete search history.

(56) References Cited

U.S. PATENT DOCUMENTS

| | | | | |
|---|---|---|---|---|
| 3,890,251 A | * | 6/1975 | Patterson | ............... H01C 7/046 252/519.1 |
| 2010/0213532 A1 | * | 8/2010 | Kamata | ............. H01L 21/28255 257/316 |
| 2013/0049200 A1 | | 2/2013 | Besser et al. | |
| 2013/0082330 A1 | * | 4/2013 | Xia | ..................... H01L 27/0629 257/368 |
| 2013/0149820 A1 | * | 6/2013 | Huang | .................. H01L 29/665 438/199 |
| 2015/0270134 A1 | * | 9/2015 | Xu | .......................... C23C 14/24 438/656 |

OTHER PUBLICATIONS

Yamamoto, Y., et al., "Study of La-Induced Flat Band Voltage Shift in Metal/HfLaOx/SiO2/Si Capacitors", Japanese Journal of Applied Physics, Nov. 6, 2007, pp. 7251-7255, vol. 46, No. 11.

(Continued)

*Primary Examiner* — Caridad Everhart
(74) *Attorney, Agent, or Firm* — Scully, Scott, Murphy & Presser, P.C.; Steven J. Meyers

(57) ABSTRACT

Semiconductor structures having a source contact and a drain contact that exhibit reduced contact resistance and methods of forming the same are disclosed. In one embodiment of the present application, the reduced contact resistance is provided by forming a layer of a dipole metal or metal-insulator-semiconductor (MIS) oxide between an epitaxial semiconductor material (providing the source region and the drain region of the device) and an overlying metal semiconductor alloy. In yet other embodiment, the reduced contact resistance is provided by increasing the area of the source region and drain region by patterning the epitaxial semiconductor material that constitutes at least an upper portion of the source region and drain region of the device.

14 Claims, 22 Drawing Sheets

(56) References Cited

OTHER PUBLICATIONS

Sinha, M., et al., "Single Silicide comprising Nickel—Dysprosium Alloy for Integration in p- and n-FinFETs with Independent Control of Contact Resistance by Aluminum Implant", VLSI Technology, 2009 Symposium, Date of Conference: Jun. 16-18, 2009, pp. 106-107, Conference Location: Honolulu, HI.

Sinha, M., et al., "Tuning the Schottky barrier height of nickel silicide on p-silicon by aluminum segregation", Applied Physics Letters 92, published online Jun. 6, 2008, pp. 222114-1 to 222114-3.

Shine, G., et al., "Limits of Specific Contact Resistivity to Si, Ge and III-V Semiconductors Using Interfacial Layers", Simulation of Semiconductor Processes and Devices (SISPAD), 2013 International Conference, Date of Conference: Sep. 3-5, 2013, pp. 69-72, Conference Location: Glasgow, IEEE.

Ok, I., et al., "Enhanced Performance in SOI FinFETs with Low Series Resistance by Aluminum Implant as a Solution Beyond 22nm Node", VLSI Technology (VLSIT), 2010 Symposium, Date of Conference: Jun. 15-17, 2010, pp. 17-18, Conference Location: Honolulu, Publisher: IEEE.

Nishimura, T., et al., "A Significant Shift of Schottky Barrier Heights at Strongly Pinned Metal/Germanium Interface by Inserting an Ultra-Thin Insulating Film", Appl. Phys. Express 1, The Japan Society of Applied Physics, published online May 9, 2008, pp. 051406-1 to 051406-3.

Lin, L., et al., "Shifting Schottky barrier heights with ultra-thin dielectric layers", Microelectronic Engineering 88, Available online Apr. 6, 2011, pp. 1461-1463.

Lee, R. T.-P., et al., "Novel and Cost-Efficient Single Metallic Silicide Integration Solution with Dual Schottky-Barrier Achieved by Aluminum Inter-diffusion for FinFET CMOS Technology with Enhanced Performance", VLSI Technology, 2008 Symposium, Date of Conference: Jun. 17-19, 2008, pp. 28-29, Conference Location: Honolulu, HI, Publisher: IEEE.

Kobayashi, M., et al., "Fermi level depinning in metal/Ge Schottky junction for metal source/drain Ge metal-oxide-semiconductor field-effect-transistor application", Journal of Applied Physics 105, published online Jan. 16, 2009, pp. 023702-1 to 023702-6.

Coss, B. E., et al., "Contact Resistance Reduction to FinFET Source/Drain Using Dielectric Dipole Mitigated Schottky Barrier Height Tuning", Electron Devices Meeting (IEDM), 2010 IEEE International, Date of Conference: Dec. 6-8, 2010, pp. 26.3.1-26.3.4, Conference Location: San Francisco, CA, Publisher: IEEE.

Lin, J.-Y., J., et al., "Increase in current density for metal contacts to n-germanium by inserting TiO2 interfacial layer to reduce Schottky barrier height", Applied Physics Letters 98, Mar. 2011, pp. 092113-1 to 092113-3.

Lieten, R. R., et al., "Ohmic contact formation on n-type Ge", Applied Physics Letters 92, Jan. 2008, pp. 022106-1 to 022106-3.

* cited by examiner

SEMICONDUCTOR STRUCTURE CONTAINING LOW-RESISTANCE SOURCE AND DRAIN CONTACTS

BACKGROUND

The present application relates to semiconductor structures and methods of forming the same. More particularly, the present application relates to methods of forming a semiconductor structure having a source contact and a drain contact that exhibit reduced contact resistance.

As silicon complementary metal oxide semiconductor (CMOS) technology reaches it fundamental scaling limits, alternative materials such as, for example, high mobility III-V compound semiconductors and silicon germanium alloys have proven to be strong candidates for extending high performance logic.

In germanium containing devices, the Fermi level pins close to the valence band so most metals form negative barriers to p-type germanium, making ohmic contact formation extremely simple because there is no barrier for the majority contacts. However, ohmic contacts for n-type germanium is complicating since the barrier height is large.

For application of high mobility metal oxide semiconductor field effect transistors (MOSFETs), the source contacts and drain contacts (herein after collectively referred to as S/D contacts) require a near zero barrier height for minimal contact resistance. As such, the strong metal/semiconductor Fermi level pinning needs to be reduced.

Traditionally, metal/semiconductor layers are used to make S/D contacts. This significantly impacts performance on a silicon germanium alloy nMOS since with advanced devices the mobility is limited by the nFET contact. Specifically, direct metal contact to a silicon germanium alloy on an nMOS seriously limits current integrated circuits from a resistance perspective. Hence, there exists a need to solve the direct metal/n-silicon germanium alloy problem to ensure continuous scaling.

SUMMARY

Semiconductor structures having a source contact and a drain contact that exhibit reduced contact resistance and methods of forming the same are disclosed. In one embodiment of the present application, the reduced contact resistance is provided by forming a layer of a dipole metal or metal-insulator-semiconductor (MIS) oxide between an epitaxial semiconductor material (providing the source region and the drain region of the device) and an overlying metal semiconductor alloy. In yet another embodiment, the reduced contact resistance is provided by increasing the area of the source region and drain region by patterning the epitaxial semiconductor material that constitutes at least an upper portion of the source region and drain region of the device.

In one embodiment of the present application, a method is provided that includes providing a structure comprising at least one first functional gate structure located on a first semiconductor material portion within a pFET device region of a semiconductor substrate and at least one second functional gate structure located on a second semiconductor material portion within an nFET device region of the semiconductor substrate. The structure also includes a first epitaxial semiconductor material located on each side of the at least one first functional gate structure and in contact with a surface of the first semiconductor material portion, and a second epitaxial semiconductor material located on each side of the at least one second functional gate structure and in contact with a surface of the second semiconductor material portion. A surface of the first epitaxial semiconductor material includes a high k dielectric layer disposed thereon. Next, a layer of a dipole metal or a metal-insulator-semiconductor oxide is formed on the second epitaxial semiconductor material, but not the first epitaxial semiconductor material. The high k dielectric layer is then removed from the surface of the first epitaxial semiconductor material, and thereafter a first metal semiconductor alloy is formed on the first epitaxial semiconductor material and a second metal semiconductor alloy is formed in direct contact with the layer of the dipole metal or the metal-insulator-semiconductor oxide.

In another embodiment of the present application, another method is provided that includes providing a structure comprising at least one first functional gate structure located on a first semiconductor material portion within a pFET device region of a semiconductor substrate and at least one second functional gate structure located on a second semiconductor material portion within an nFET device region of the semiconductor substrate. A first epitaxial semiconductor material is located on each side of the at least one first functional gate structure and in contact with a surface of the first semiconductor material portion, and a second epitaxial semiconductor material is located on each side of the at least one second functional gate structure and in contact with a surface of the second semiconductor material portion. An additional semiconductor material is formed atop at least one of the first epitaxial semiconductor material and the second epitaxial semiconductor material. Next, the additional semiconductor material is patterned.

In yet another embodiment of the present application, a semiconductor structure is provided. The semiconductor structure includes at least one first functional gate structure located on a first semiconductor material portion within a pFET device region of a semiconductor substrate and at least one second functional gate structure located on a second semiconductor material portion within an nFET device region of the semiconductor substrate. A first epitaxial semiconductor material is located on each side of the at least one first functional gate structure and in contact with a surface of the first semiconductor material portion, and a second epitaxial semiconductor material is located on each side of the at least one second functional gate structure and in contact with a surface of the second semiconductor material portion. A layer of a dipole metal or a metal-insulator-semiconductor oxide is present on the second epitaxial semiconductor material, but not the first epitaxial semiconductor material. A first metal semiconductor alloy is located on the first epitaxial semiconductor material, and a second metal semiconductor alloy is in direct contact with the layer of the dipole metal or the metal-insulator-semiconductor oxide.

In a further embodiment of the present application, another semiconductor structure is provided. The semiconductor structure includes at least one first functional gate structure located on a first semiconductor material portion within a pFET device region of a semiconductor substrate and at least one second functional gate structure located on a second semiconductor material portion within an nFET device region of the semiconductor substrate. A first epitaxial semiconductor material is located on each side of the at least one first functional gate structure and in contact with a surface of the first semiconductor material portion, and a second epitaxial semiconductor material is located on each side of the at least one second functional gate structure and in contact with a surface of the second semiconductor material portion. An additional semiconductor material is present atop at least one of the first epitaxial semiconductor material and the second epitaxial semiconductor material. In accordance with this embodiment of the present application, the additional semiconductor material has a patterned topmost surface or a patterned sidewall surface.

DESCRIPTION

Figure 1A:
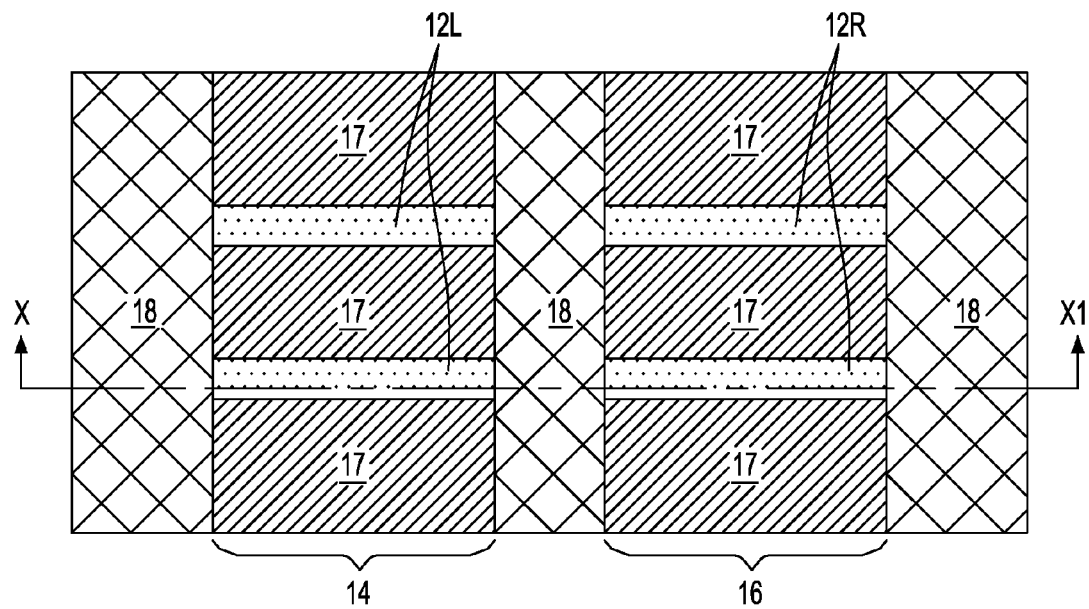
FIG. 1A is a top down view illustrating an exemplary semiconductor structure including a plurality of first semiconductor material portions located within a pFET device region of a substrate and a plurality of second semiconductor material portions located within an nFET device region of the substrate, wherein a trench isolation structure separates each first semiconductor material portion from each second semiconductor material portion.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It should be noted that although the following description and drawings illustrate the basic processing steps employed to form source/drain contacts in which the contact resistance caused by direct contact between a metal and a semiconductor is reduced in a gate-last processing flow for FinFET structures, the basic concept of the present application can also be used in a gate-first processing flow. Furthermore, the basic concept of the present application can be applied to form source/drain contacts with reduced contact resistance for planar field effect transistor devices as well.

Figure 1B:
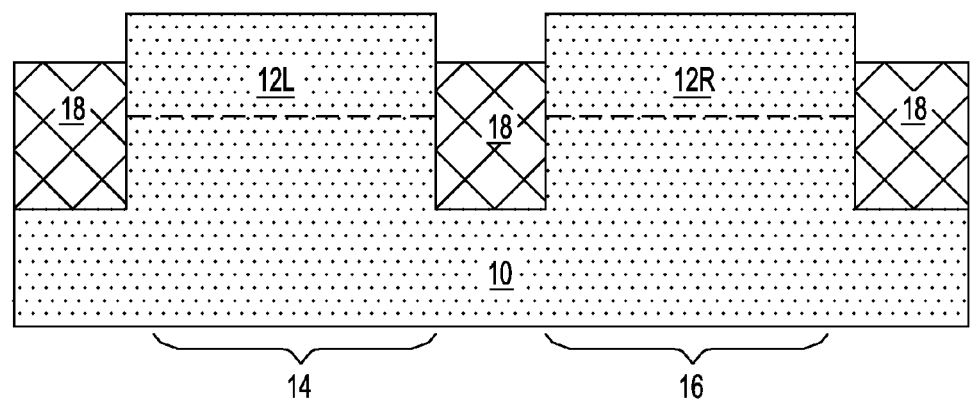
FIG. 1B is a cross sectional view of the exemplary semiconductor structure of FIG. 1A along vertical plane X-X1.

Referring first to FIGS. 1A-1B, there are illustrated an exemplary semiconductor structure including a plurality of first semiconductor material portions 12L located within a pFET device region 14 of a substrate 10 and a plurality of second semiconductor material portions 12R located within an nFET device region 16 of the substrate 10, wherein a trench isolation structure 18 separates each first semiconductor material portion 12L from each second semiconductor material portion 12R. In some embodiments of the present application, each first semiconductor material portion 12L may be referred to as a first semiconductor fin, while each second semiconductor material portion 12R may be referred to herein as a second semiconductor fin.

The exemplary semiconductor structure shown in FIGS. 1A-1B can be formed by first providing a bulk semiconductor substrate. The term "bulk" as used in conjunction with the phrase "semiconductor substrate" denotes that the entire substrate is comprised of at least one semiconductor material. Examples of semiconductor materials that can be used as the semiconductor material of the bulk semiconductor substrate include, but are not limited to, Si, Ge, SiGe, SiC, SiGeC, III/V compound semiconductors such as, for example, InAs, InP, InAsP, and GaAs, and II/VI compound semiconductor materials.

In some embodiments of the present application, the bulk semiconductor substrate may be a single crystalline semiconductor material. In other embodiments of the present application, the bulk semiconductor substrate may be a polycrystalline semiconductor material or an amorphous semiconductor material. The crystal orientation of the bulk semiconductor substrate may be {100}, {110}, or {111}. Other crystallographic orientations besides those specifically mentioned can also be used in the present application.

Next, a hard mask layer (not shown) is formed on a topmost surface of the bulk semiconductor substrate. The hard mask layer that is employed in the present application may include a semiconductor oxide, a semiconductor nitride and/or a semiconductor oxynitride. In one embodiment, the hard mask material that can be used in providing the hard mask layer can be comprised of silicon dioxide. In another embodiment, the hard mask material that can be used in providing the hard mask layer can be comprised of silicon nitride. In yet another embodiment, the hard mask material that can be used in providing the hard mask layer can be a stack comprised of, in any order, silicon dioxide and silicon nitride.

In some embodiments, the hard mask material that can be used in providing the hard mask layer can be formed by a deposition process such as, for example, chemical vapor deposition (CVD) and plasma enhanced chemical vapor deposition (PECVD). In other embodiments, the hard mask material that can be used in providing the hard mask layer can be formed by a thermal process such as, for example, thermal oxidation and/or thermal nitridation. In yet other embodiments, the hard mask material that can be used in providing the hard mask layer can be formed by a combination of a deposition process and a thermal process.

Next, semiconductor material portions can be formed. Each semiconductor material portion that is formed extends upward from a remaining portion of the bulk semiconductor substrate.

The remaining portion of the bulk semiconductor substrate can be referred to herein as substrate 10. At this point of the present application, a topmost surface of each semiconductor material portion is capped with a remaining portion of the hard mask layer (not shown). Since each semiconductor material portion is formed from a bulk semiconductor substrate, no material interface is present between each semiconductor material portion and substrate 10.

The plurality of semiconductor material portions can be formed by patterning the material stack of the hard mask layer and an upper portion of the bulk semiconductor substrate. During the patterning of material stack of the hard mask layer and an upper portion of the bulk semiconductor substrate, a plurality of trenches (not shown) are formed into the hard mask layer and the upper portion of the bulk semiconductor substrate. Each trench that is formed extends completely through the hard mask layer, but only partially into the bulk semiconductor substrate. These trenches will be subsequently processed into local isolation structures 17.

In one embodiment, the patterning process includes a sidewall image transfer (SIT) process. The SIT process includes forming a contiguous mandrel material layer (not shown) on the topmost surface of the hard mask layer. The contiguous mandrel material layer (not shown) can include any material (semiconductor, dielectric or conductive) that can be selectively removed from the structure during a subsequently performed etching process. In one embodiment, the contiguous mandrel material layer (not shown) may be composed of amorphous silicon or polysilicon. In another embodiment, the contiguous mandrel material layer (not shown) may be composed of a metal such as, for example, Al, W, or Cu. The contiguous mandrel material layer (not shown) can be formed, for example, by chemical vapor deposition or plasma enhanced chemical vapor deposition. The thickness of the contiguous mandrel material layer (not shown) can be from 50 nm to 300 nm, although lesser and greater thicknesses can also be employed. Following deposition of the contiguous mandrel material layer (not shown), the contiguous mandrel material layer (not shown) can be patterned by lithography and etching to form a plurality of mandrel structures (also not shown) on the surface of the hard mask layer.

The SIT process continues by forming a dielectric spacer on each sidewall of each mandrel structure. The dielectric spacer can be formed by deposition of a dielectric spacer material and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, for example, chemical vapor deposition (CVD), plasma enhanced chemical vapor deposition (PECVD), and atomic layer deposition (ALD).

Examples of etching that be used in providing the dielectric spacers include any etching process such as, for example, reactive ion etching. Since the dielectric spacers are used in the SIT process as an etch mask, the width of the each dielectric spacer determines the width of each semiconductor material portion.

After formation of the dielectric spacers, the SIT process continues by removing each mandrel structure. Each mandrel structure can be removed by an etching process that is selective for removing the mandrel material as compared to the material of the dielectric spacers and hard mask layer. Following the mandrel structure removal, the SIT process continues by transferring the pattern provided by the dielectric spacers into the hard mask layer and then into an upper portion of the bulk semiconductor substrate. The pattern transfer may be achieved by an etching process. Examples of etching processes that can used to transfer the pattern may include dry etching (i.e., reactive ion etching, plasma etching, ion beam etching or laser ablation) and/or a chemical wet etch process. In one example, the etch process used to transfer the pattern may include one or more reactive ion etching steps. Upon completion of the pattern transfer, the SIT process concludes by removing the dielectric spacers from the structure. Each dielectric spacer may be removed by etching or a planarization process.

During the patterning process a plurality of trenches is also formed into the hard mask layer and the upper portion of the bulk semiconductor substrate. Each trench is then filled with a trench dielectric material such as, for example, an oxide. Optionally, a liner may be formed in each trench prior to trench fill, a densification step may be performed after the trench fill and a recess etch may follow the trench fill as well. The trenches that are processed in this manner provide local isolation structures 17.

After forming the local isolation structures 17, a trench isolation structure 18 is formed through each semiconductor material portion and into the bulk semiconductor substrate. Trench isolation structure 18 (which has a bottommost surface that is deeper than a bottommost surface of each local isolation structure 17) can be formed by lithography, etching, and then filling a trench with a trench dielectric material. An etch back process may follow the filling of the trench that provides the trench isolation structure 18. The formation of trench isolation structure 18 cuts each semiconductor material portion forming the plurality of first semiconductor material portions 12L in a pFET device region 14 of substrate 10, and the plurality of second semiconductor material portions 12R in the nFET device region 16. As stated above, each first semiconductor material portion 12L may be referred to herein as a first semiconductor fin, while each second semiconductor material portion 12R may be referred to herein as a second semiconductor fin.

As used herein, a "fin" refers to a contiguous structure including a semiconductor material, such as, for example, silicon, and including a pair of substantially vertical sidewalls that are parallel to each other. As used herein, a surface is "substantially vertical" if there exists a vertical plane from which the surface does not deviate by more than three times the root mean square roughness of the surface. Each first and second semiconductor material portion 12L, 12R comprises a same material as the upper portion of the bulk semiconductor substrate.

In one embodiment of the present application, each first and second semiconductor material portion 12L, 12R has a height from 10 nm to 100 nm, and a width from 4 nm to 30 nm. In another embodiment of the present application, each first and second semiconductor material portion 12L, 12R has a height from 15 nm to 50 nm, and a width from 5 nm to 12 nm. At this point of the present application, the remaining hard mask layer can be removed from atop each first and second semiconductor material portion 12L, 12R by performing a planarization process such as, for example, chemical mechanical planarization.

Figure 2A:
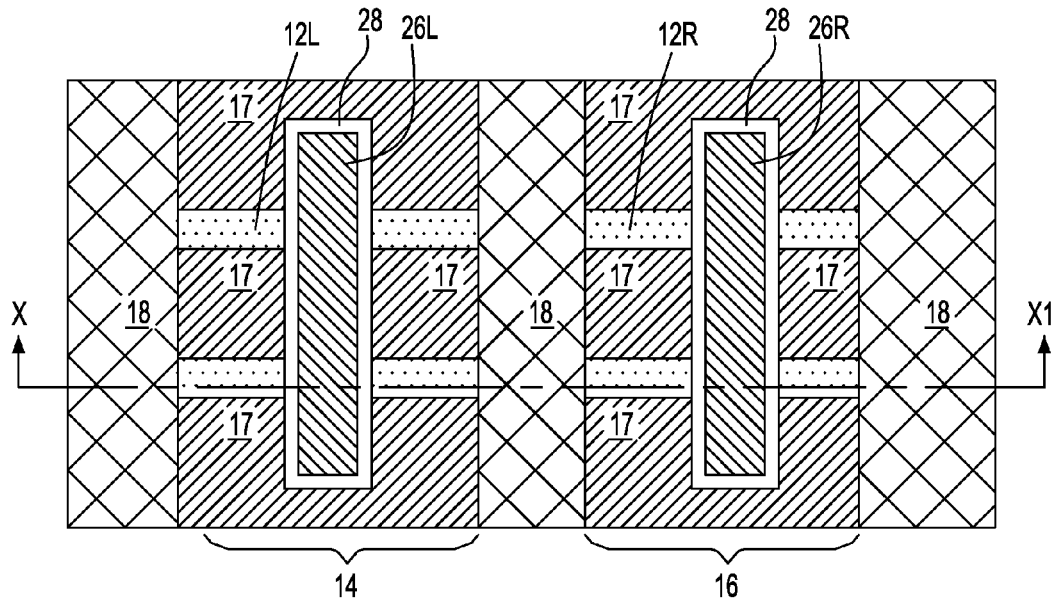
FIG. 2A is a top down view of the exemplary semiconductor structure of FIG. 1A after forming at least one first sacrificial gate structure straddling each first semiconductor material portion and at least one second sacrificial gate structure straddling each second semiconductor material portion.
Figure 2B:
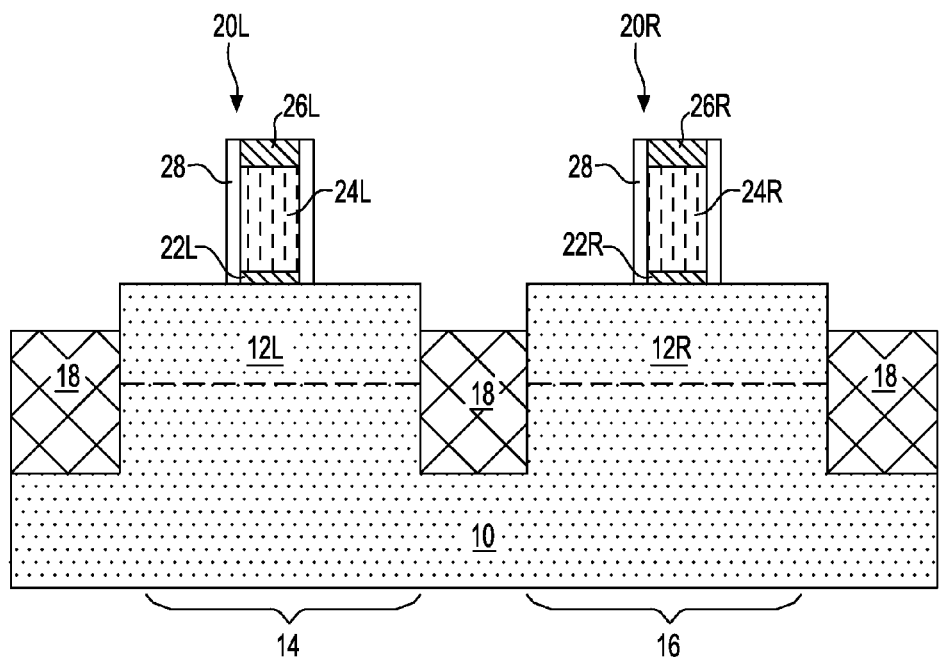
FIG. 2B is a cross sectional view of the exemplary semiconductor structure of FIG. 2A along vertical plane X-X1.

Referring now to FIGS. 2A-2B, there are shown the exemplary semiconductor structure of FIGS. 1A-1B after forming at least one first sacrificial gate structure 20L straddling each first semiconductor material portion 12L and at least one second sacrificial gate structure 20R straddling each second semiconductor material portion 12R. Although a single first and second sacrificial gate structure are described and illustrated, a plurality of the same can be formed in each device region of the structure. Each first sacrificial gate structure 20L, and each second sacrificial gate structure 20R comprises, from bottom to top, a sacrificial gate dielectric portion 22L, 22R, a sacrificial gate portion 24L, 24R and a sacrificial dielectric cap portion 26L, 26R.

By "straddling" it is meant that each sacrificial gate structure is present on a topmost surface and sidewall surfaces of a semiconductor material portion. The term "sacrificial gate structure" is used throughout the present application to denote a material stack that serves as a placeholder material for a functional gate structure to be subsequently formed.

Each first sacrificial gate structure 20L and each second sacrificial gate structure 20R can be formed by first forming blanket layers of various materials over the exemplary semiconductor structure shown in FIGS. 1A-1B, and then patterning the various materials by lithography and an etching. Notably, each first sacrificial gate structure 20L and each second sacrificial gate structure 20R can be formed by first depositing a blanket layer of a sacrificial gate dielectric material. The sacrificial gate dielectric material can be an oxide, nitride, and/or oxynitride. In one example, the sacrificial gate dielectric material can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation.

After forming the blanket layer of sacrificial gate dielectric material, a blanket layer of a sacrificial gate material is formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material is formed. The sacrificial gate cap material may include one of the materials mentioned above for the hard mask layer that was employed in forming the semiconductor material portions. The sacrificial gate cap material can be formed utilizing one of the techniques mentioned above for forming the hard mask layer.

After providing the above mentioned sacrificial material stack, a photoresist material is formed atop the sacrificial gate cap material, and thereafter the photoresist material is patterned by exposing the photoresist material to a pattern of irradiation and then developing the resist material. After providing the patterned photoresist atop the sacrificial gate cap material, an etch such as, for example, an anisotropic dry etch or wet etch process can be employed to transfer the pattern into the blanket sacrificial material stack. The patterned resist material can be removed after the pattern transfer etch by utilizing a resist stripping process such as, for example, ashing. The remaining portions of the sacrificial gate dielectric material constitute a sacrificial gate dielectric portion 22L, 22R, the remaining portions of the sacrificial gate material constitute a sacrificial gate portion 24L, 24R, and the remaining portions of the sacrificial dielectric cap material constitute a sacrificial dielectric cap portion 26L, 26R.

In some embodiments of the present application, the patterning of the sacrificial material stack may include a sidewall image transfer process similar to the one mentioned above in forming the first and second semiconductor material portions.

Following the formation of the first and second sacrificial gate structures 20L, 20R, a dielectric spacer 28 can be formed on the exposed sidewall surfaces of each first sacrificial gate structure 20L, and each second sacrificial gate structure 20R. The dielectric spacer 28 can be formed by first providing a dielectric spacer material and then etching the dielectric spacer material. Examples of dielectric spacer materials that may be employed in the present application include dielectric oxides, dielectric nitrides and/or dielectric oxynitrides. In one embodiment, the dielectric spacer material used in providing each dielectric spacer 28 is composed of silicon dioxide or silicon nitride. The dielectric spacer material may be provided by a deposition process including, for example, chemical vapor deposition (CVD), plasma enhanced chemical vapor deposition (PECVD), or physical vapor deposition (PVP). The etch used to provide the dielectric spacer 28 may comprise a dry etching process such as, for example, reactive ion etching.

Prior to forming the dielectric spacer 28, an ion implantation process can be used to dope exposed portions of each first semiconductor material portion 12L not protected by a first sacrificial gate structure 20L, and to dope exposed portions of each second semiconductor material portion 12R not protected by a second gate structure 20R. The ion implantation can form extension regions and/or halo regions (both not shown) within the exposed first and second semiconductor material portions 12L, 12R.

Figure 3A:
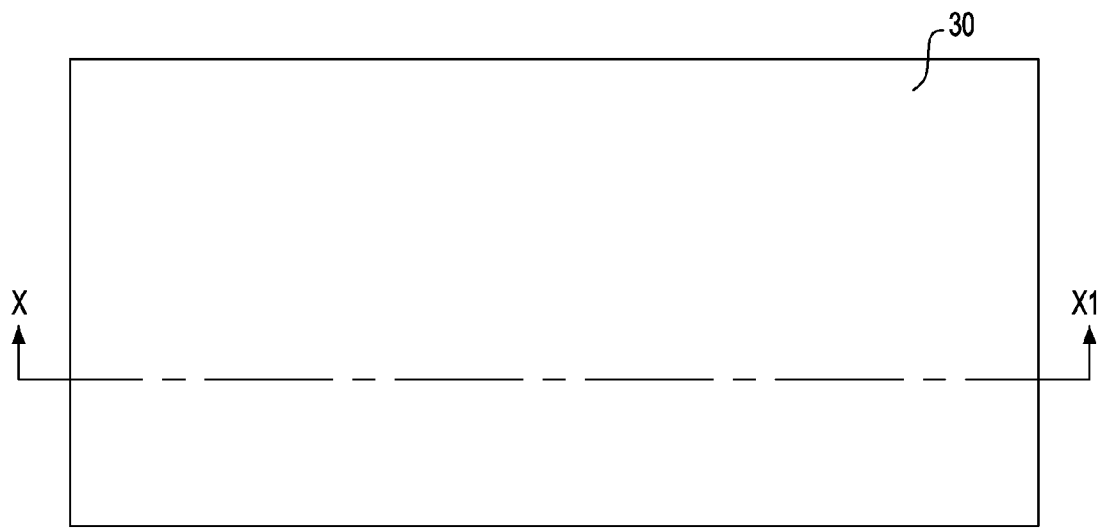
FIG. 3A is a top down view of the exemplary semiconductor structure of FIG. 2A after forming a dielectric protection layer.
Figure 3B:
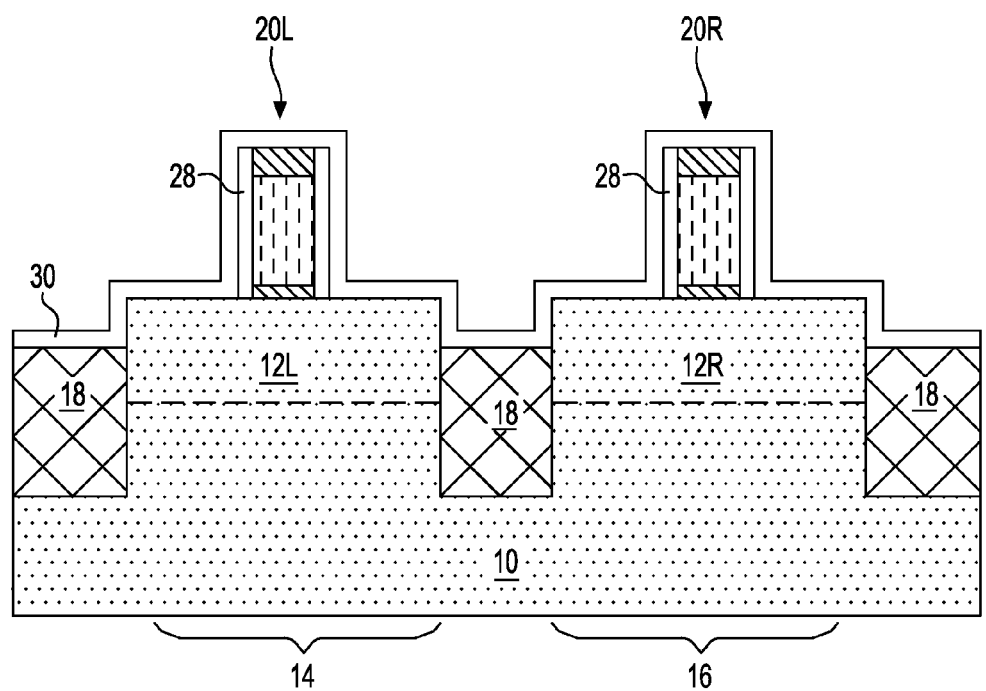
FIG. 3B is a cross sectional view of the exemplary semiconductor structure of FIG. 3A along vertical plane X-X1.

Referring now to FIGS. 3A-3B, there is illustrated the exemplary semiconductor structure of FIGS. 2A-2B after forming a dielectric protection layer 30. The dielectric protection layer 30 is formed on all exposed surfaces of the exemplary semiconductor structure including atop each local isolation structure 17, each trench isolation structure 18, each first semiconductor material portion 12L, each second semiconductor material portion 12R, each dielectric spacer 28 and each first sacrificial gate structure 20L, and each second sacrificial gate structure 20R. The dielectric protection layer 30 is formed utilizing a deposition process including, for example, CVD and PECVD. The dielectric protection layer 30 includes a dielectric material that is at least different from the dielectric spacer material used in providing the dielectric spacer 28. In one embodiment, the dielectric protection layer 30 comprises silicon nitride, and each dielectric spacer 28 comprises silicon dioxide. The dielectric protection layer 30 is a conformal layer having a thickness in a range from 1 nm to 50 nm.

Figure 4A:
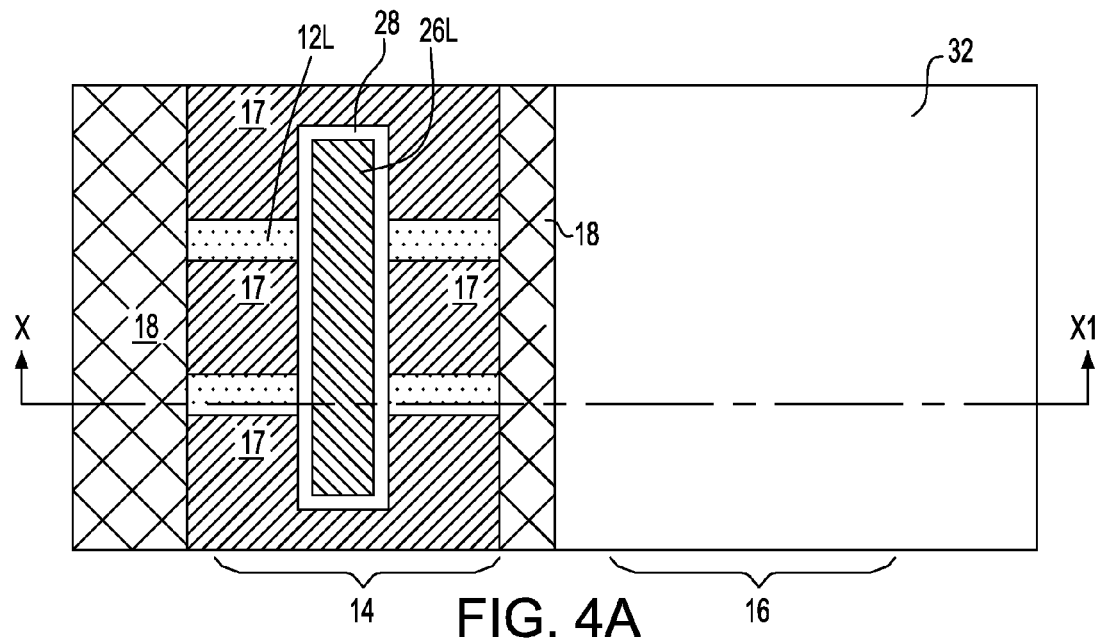
FIG. 4A is a top down view of the exemplary semiconductor structure of FIG. 3A after removing the dielectric protection layer from the pFET device region of the substrate.
Figure 4B:
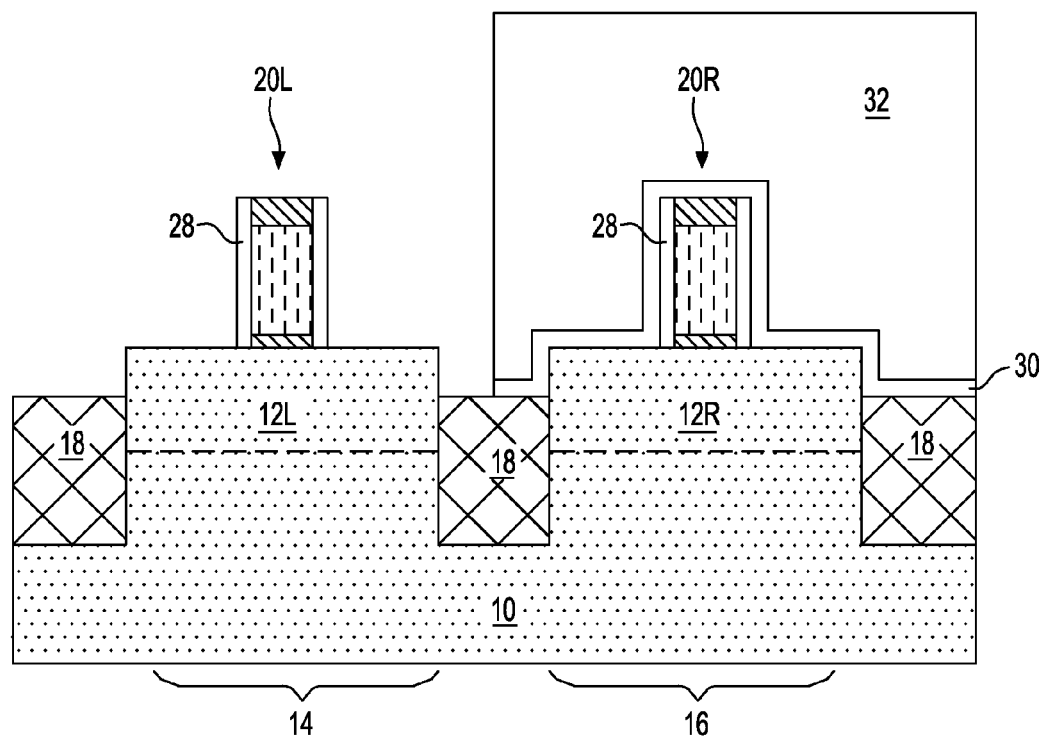
FIG. 4B is a cross sectional view of the exemplary semiconductor structure of FIG. 4A along vertical plane X-X1.

Referring now to FIGS. 4A-4B, there is illustrated the exemplary semiconductor structure of FIGS. 3A-3B after removing the dielectric protection layer 30 from the pFET device region 14 of the substrate 10; it is noted that dielectric protection layer 30 remains in the nFET device region 16. The removal of the dielectric protection layer 30 from the pFET device region 14, but not the nFET device region 16 includes first forming a block mask 32 such as, for example, a hard mask and/or a photoresist material, protecting only the nFET device region 16. For example, a block mask material can first be deposited over the entire exemplary semiconductor structure, and lithography and etching can be used to provide the block mask 32 only over the nFET device region 16. With the block mask 32 in place, the exposed dielectric protection layer 30 is removed from the pFET device region 14 by utilizing an etch that is selective in removing the dielectric material that provides the dielectric protection layer 30.

Figure 5A:
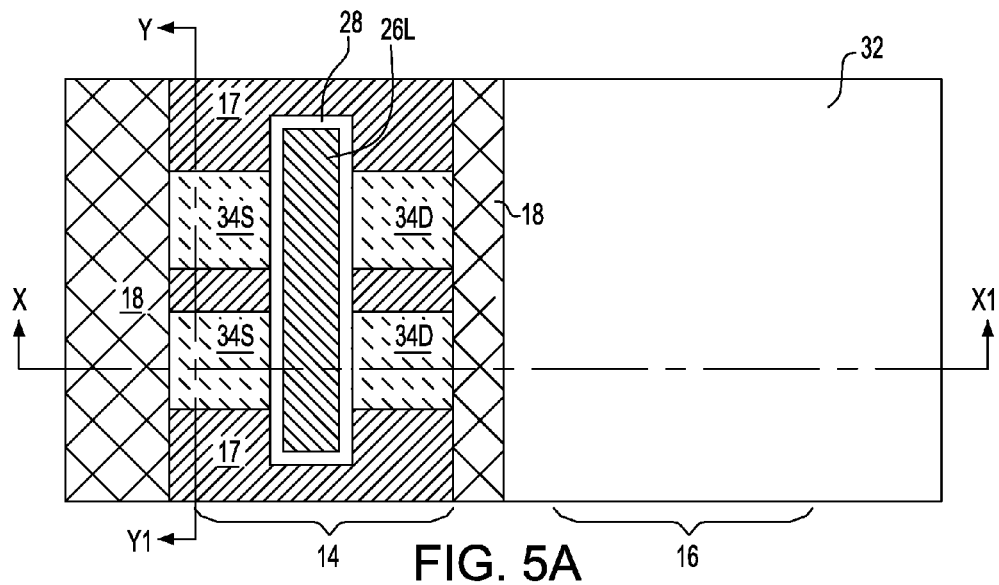
FIG. 5A is a top down view of the exemplary semiconductor structure of FIG. 4A after recessing exposed portions of each first semiconductor material portion in the pFET device region to provide recessed regions, and forming a first epitaxial semiconductor material within the recessed regions.
Figure 5B:
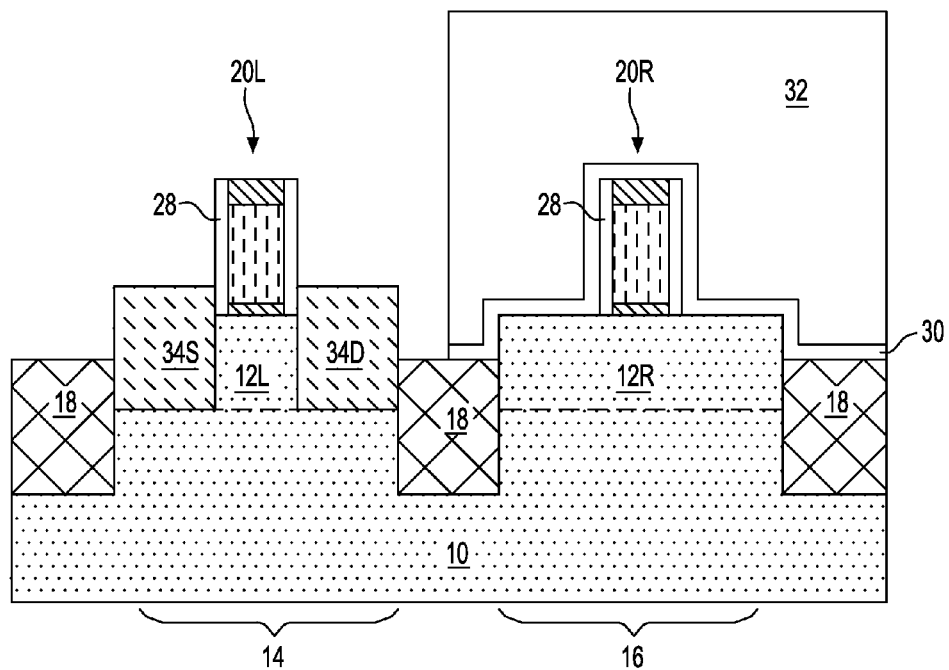
FIG. 5B is a cross sectional view of the exemplary semiconductor structure of FIG. 5A along vertical plane X-X1.
Figure 5C:
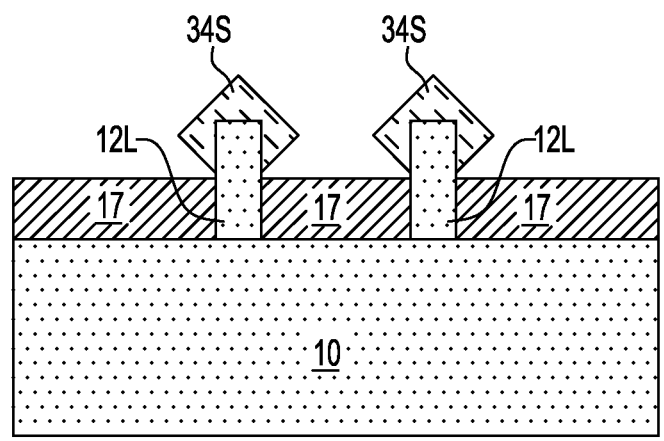
FIG. 5C is a cross sectional view of the exemplary semiconductor structure of FIG. 5A along vertical plane Y-Y1.

Referring now to FIGS. 5A-5C, there are illustrated the exemplary semiconductor structure of FIGS. 4A-4B after recessing exposed portions of the first semiconductor material portion 12L in the pFET device region 14 to provide recessed regions, and forming a first epitaxial semiconductor material within the recessed region and on each side of the sacrificial gate structure 20L. On one side of the sacrificial gate structure 12L the first epitaxial semiconductor material forms a source region 34S, and on the other side of the sacrificial gate structure 12, the first epitaxial semiconductor material forms a drain region 34D.

The recessed regions can be formed by utilizing an etch that is selective in removing semiconductor material as compared to dielectric material and/or conductive materials. In one embodiment, the recessed regions can be formed utilizing a $H_3PO_4$ wet or $CF_4$, $CF_6$, $O_2$, and $N_2$ combination dry etch. The recessed regions that are formed have a depth, as measured from the original topmost surface of the first semiconductor material portion 12L to the now exposed sub-surface portion of the first semiconductor material portion 12L, of from 0.1 nm to 60 nm. Each recessed region that is provided in the first semiconductor material portions 12L is located at a footprint of each first sacrificial gate structure 20L. In some embodiments, no recess etch is performed prior to formation of the first epitaxial semiconductor material.

Following the etch that provides the recessed regions, an epitaxial deposition process is used to form the first epitaxial semiconductor material that provides the source region 34S and the drain region 34D. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth process apparatuses that are suitable for use in forming the first epitaxial semiconductor material include, e.g., rapid thermal chemical vapor deposition (RTCVD), low-energy plasma deposition (LEPD), ultra-high vacuum chemical vapor deposition (UH-VCVD), atmospheric pressure chemical vapor deposition (APCVD) and molecular beam epitaxy (MBE). The temperature for epitaxial deposition process for forming the first epitaxial semiconductor material typically ranges from 550° C. to 900° C. Although higher temperature typically results in faster deposition, the faster deposition may result in crystal defects and film cracking.

The first epitaxial semiconductor material can be comprised of one of the semiconductor materials mentioned above for the bulk semiconductor substrate. In one embodiment, the first epitaxial semiconductor material comprises a same semiconductor material as the bulk semiconductor substrate. In such an embodiment, no material interface would exist between the first semiconductor material portion 12L and the first epitaxial semiconductor material. In another embodiment, the first epitaxial semiconductor material comprises a different semiconductor material as the bulk semiconductor substrate. In such an embodiment, a material interface would exist between the first semiconductor material portion 12L and the first epitaxial semiconductor material. For example, and when the bulk semiconductor substrate is comprised of silicon, then the first epitaxial semiconductor material can be comprised of a silicon germanium alloy. In such an embodiment, a strain can be induced upon each first semiconductor material portion 12L that is located beneath the first sacrificial gate structure 20L.

A number of different source gases may be used for the deposition of the first epitaxial semiconductor material. In some embodiments, the source gas for the deposition of the first epitaxial semiconductor material includes a silicon containing gas source, a germanium containing gas source, or a combination thereof. For example, an epitaxial Si layer may be deposited from a silicon gas source that is selected from silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In some embodiments, dopants (i.e., n-type or p-type as mentioned above) can be introduced into the first epitaxial semiconductor material during the epitaxial growth process to provide source region 34S and drain region 34D. In other embodiments, dopants (i.e., n-type or p-type as mentioned above) can be introduced into first epitaxial semiconductor material after the epitaxial growth process by ion implantation or gas phase doping. In either embodiment, the first epitaxial semiconductor material can contain dopant atoms therein.

As is observed from the cross sectional view shown in FIG. 5C, the first epitaxial semiconductor material, i.e., the source region 34S, forms on sidewall surfaces and on a topmost surface of each exposed first semiconductor material portion 12L. Also, and as shown in the drawings, each first epitaxial semiconductor material that is formed has a non-planar topmost surface. In some embodiments, a diamond shaped first epitaxial semiconductor material (and thus a diamond shape source region 34S) is formed surrounding the exposed portions of each first semiconductor material portion 12L. Although not specifically shown, the drain region 34D would look the same as the source region 34S.

Figure 6A:
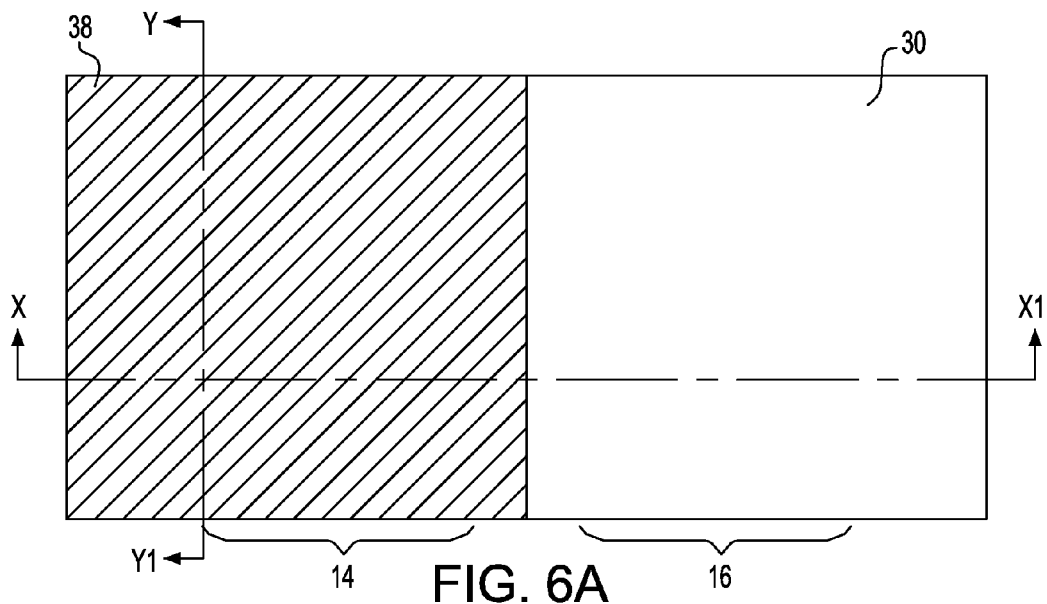
FIG. 6A is a top down view of the exemplary semiconductor structure of FIG. 5A after forming a high k dielectric layer and another dielectric protection layer in the pFET device region.
Figure 6B:
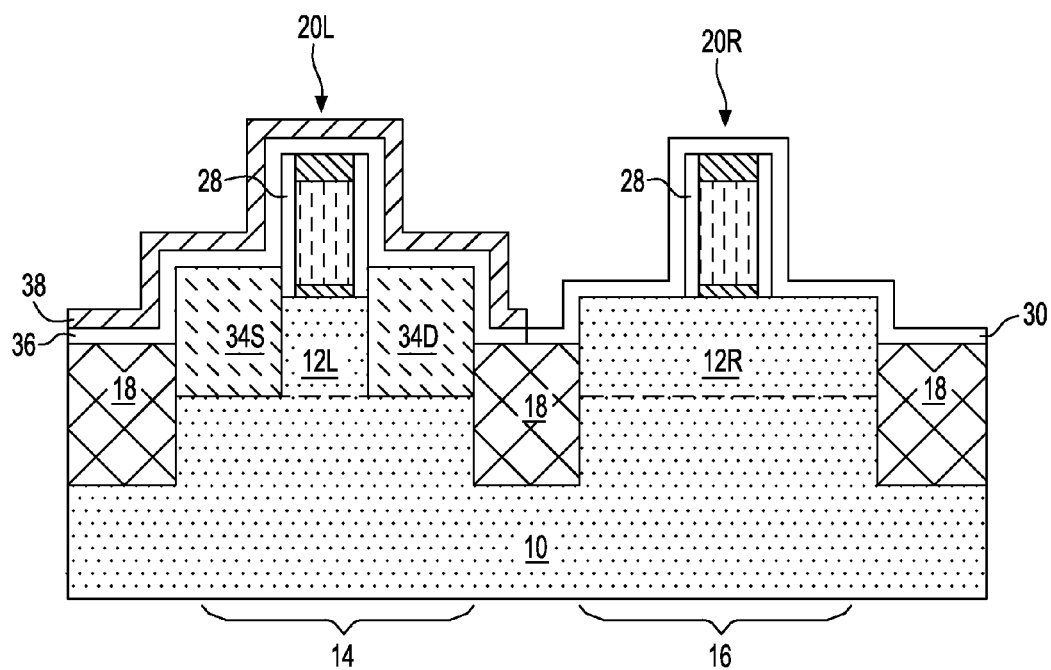
FIG. 6B is a cross sectional view of the exemplary semiconductor structure of FIG. 6A along vertical plane X-X1.
Figure 6C:
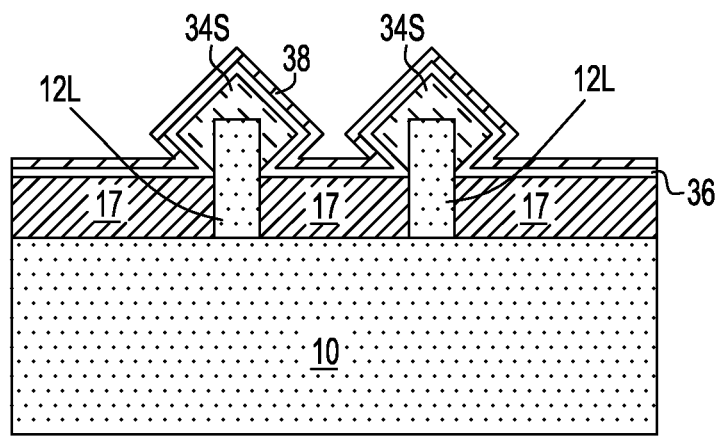
FIG. 6C is a cross sectional view of the exemplary semiconductor structure of FIG. 6A along vertical plane Y-Y1.

Referring now to FIGS. 6A-6C, there are illustrated the exemplary semiconductor structure of FIGS. 5A-5C after forming a high k dielectric layer 36 and another dielectric protection layer 38 in the pFET device region 14. The high k dielectric layer 36 and the another dielectric protection layer 38 are formed while maintaining the block mask 32 in the nFET device region 16.

As is shown, the high k dielectric layer 36 has portions that directly contact a sidewall surface and a topmost surface of each first epitaxial semiconductor material (i.e., source region 34S and drain region 34D). The high k dielectric layer 36 also has portions that are formed around each of the first sacrificial gate structures 20L. Further, the high k dielectric layer 36 can have portions that are located on exposed portions of the trench isolation structures 18.

The term "high k" is used throughout the present application to denote a dielectric material that has a dielectric constant that is greater than silicon dioxide. Exemplary high-k dielectrics that can be used as the high k dielectric layer 36 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O$—$N_y$, SiON, $SiN_x$, a silicate thereof, and an alloy thereof. Each value of x is independently from 0.5 to 3 and each value of y is independently from 0 to 2. The high k dielectric layer 36 can be formed by any deposition technique including, for example, chemical vapor deposition (CVD), plasma enhanced chemical vapor deposition (PECVD), physical vapor deposition (PVD), sputtering, or atomic layer deposition.

After forming the high k dielectric layer 36, the another dielectric protection layer 38 is formed on the exposed surface of the high k dielectric layer 36 and only in the pFET device region 14 since block mask 32 remains protecting the pFET device region 16. The another dielectric protection layer 38 may include one of the materials mentioned above for dielectric protection layer 30. Also, the another dielectric protection layer 38 can be formed utilizing one of the techniques mentioned above in forming the dielectric protection layer 30.

Following the formation of the another dielectric protection layer 38, the block mask 32 and any other material (i.e., high k dielectric material and dielectric protection material) is removed from the nFET device region 16 providing the exemplary semiconductor structure shown in FIGS. 6A-6C. The block mask 32 can be removed by conventional techniques such as etching or stripping as are well known to those skilled in the art.

Figure 7A:
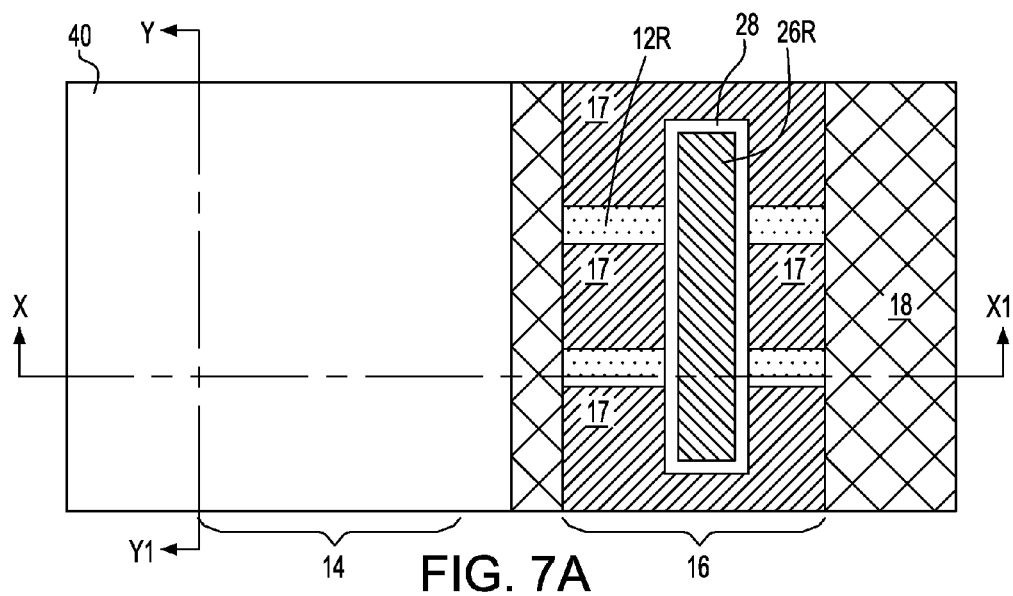
FIG. 7A is a top down view of the exemplary semiconductor structure of FIG. 6A after removing the dielectric protection layer from the nFET device region.
Figure 7B:
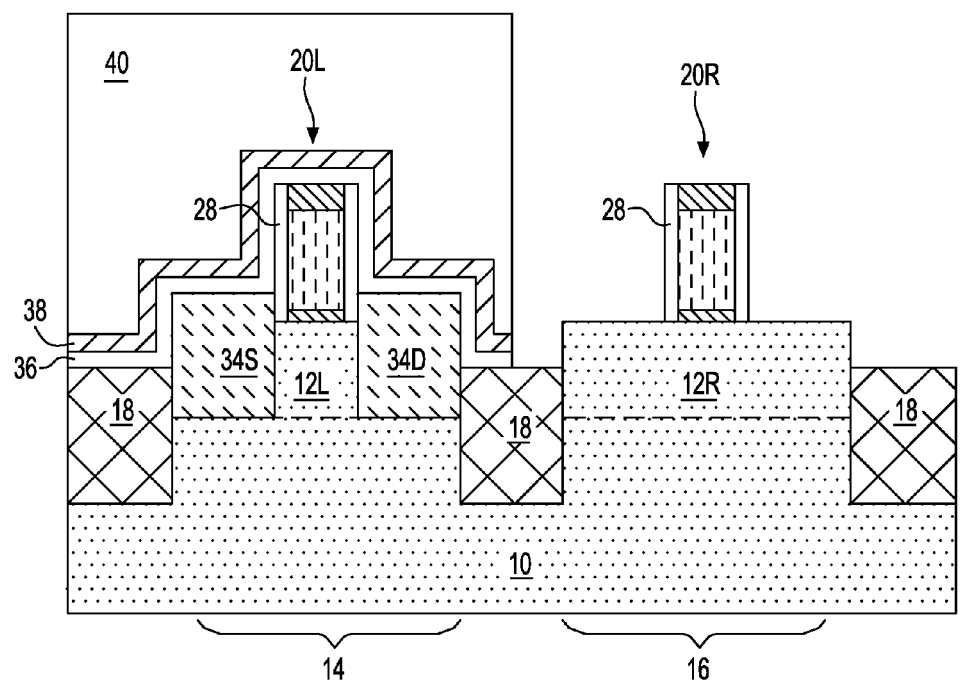
FIG. 7B is a cross sectional view of the exemplary semiconductor structure of FIG. 7A along vertical plane X-X1.
Figure 7C:
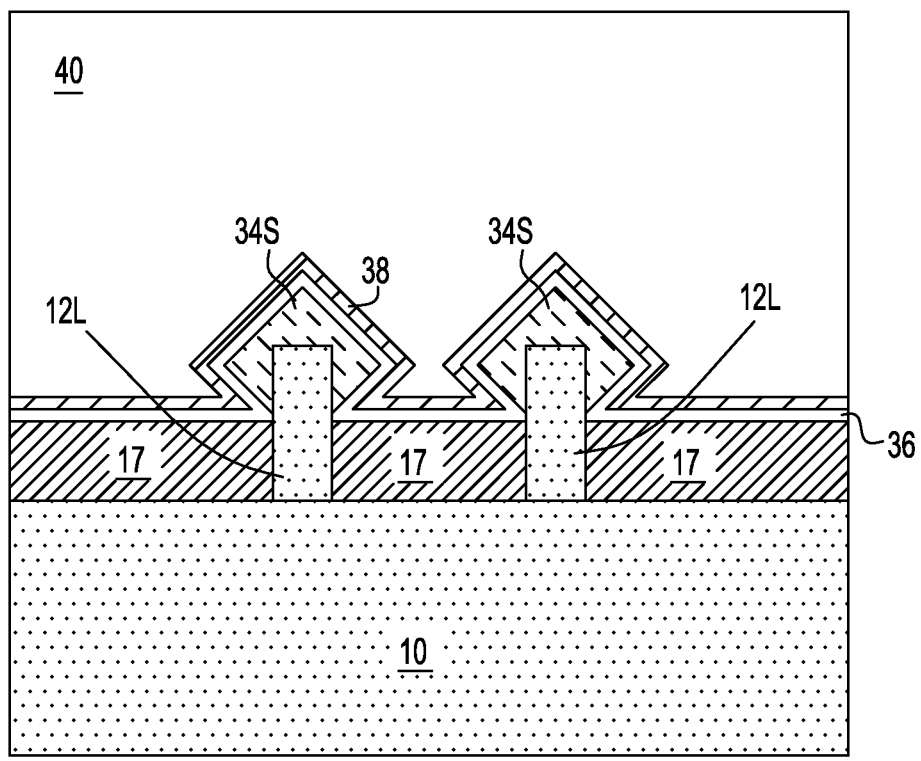
FIG. 7C is a cross sectional view of the exemplary semiconductor structure of FIG. 7A along vertical plane Y-Y1.

Referring now to FIGS. 7A-7C, there are illustrated the exemplary semiconductor structure of FIGS. 6A-6C after removing the dielectric protection layer 30 from the nFET device region 16. The removal of the dielectric protection layer 30 from the nFET device region 16 includes first forming another block mask 40 over the pFET device region 14. The another block mask 40 can include one of block mask materials mentioned above in providing block mask 32. Also, the another block mask 40 can be formed utilizing the technique mentioned above in forming block mask 32.

Following the formation of the another block mask 40 in the pFET device region 14, the dielectric protection layer 30 that is present in the nFET device region 16 is removed by utilizing an etching process as mentioned above for removing the dielectric protection layer 30 from the pFET device region 14.

The removal of the dielectric protection layer 30 from the nFET device region 16 exposes surfaces of each second semiconductor material portion 12R that are not covered by either the second sacrificial gate structure 20R and the dielectric spacer 28.

Referring now to FIGS. 8A-8D, there are illustrated the exemplary semiconductor structure of FIGS. 7A-7C after recessing exposed portions of the second semiconductor material portion 12R in the nFET device region 16 to provide recessed regions, forming a second epitaxial semiconductor material within the recessed regions, and removing the another block mask 40.

The recessed regions that are provided into the second semiconductor material portions 12R can be formed by utilizing an etch as described above for forming the recessed regions in the first semiconductor material portions 12L. The recessed regions that are formed have a depth, as measured from the original topmost surface of the second semiconductor material portion 12R to the now exposed sub-surface portion of the second semiconductor material portion 12R, of from 0.1 to 60 nm. Each recessed region that is provided in the second semiconductor material portions 12R is located at a footprint of each second sacrificial gate structure 20R. In some embodiments, no recess etch is performed prior to formation of the second epitaxial semiconductor material.

Following the etch that provides the recessed regions, an epitaxial deposition process such as mentioned above is used to form the second epitaxial semiconductor material which provides a source region 42S and a drain region 42D in the nFET device region 16. The second epitaxial semiconductor material can be formed within one of the epitaxial deposition apparatus described above and the epitaxial deposition conditions can also be the same as that described above for forming the second epitaxial semiconductor material.

The second epitaxial semiconductor material can be comprised of one of the semiconductor materials mentioned above for the bulk semiconductor substrate. In one embodiment, the second epitaxial semiconductor material comprises a same semiconductor material as the bulk semiconductor substrate and a same semiconductor material as the first epitaxial semiconductor material. In such an embodiment, no material interface would exist between the second semiconductor material portion 12R and the second epitaxial semiconductor material that provides source region 42S and drain region 42D. In another embodiment, the second epitaxial semiconductor material comprises a same semiconductor material as the bulk semiconductor substrate, but a different semiconductor material as that used in provided the first epitaxial semiconductor material. For example, and when the bulk semiconductor substrate is comprised of silicon, then the second epitaxial semiconductor material is also comprised of silicon, while the first epitaxial semiconductor material can be comprised of a silicon germanium alloy.

In some embodiments, dopants (i.e., n-type or p-type as mentioned above) can be introduced into the second epitaxial semiconductor material during the epitaxial growth process. In other embodiments, dopants (i.e., n-type or p-type as mentioned above) can be introduced into second epitaxial semiconductor material after the epitaxial growth process by ion implantation or gas phase doping. In either embodiment, the second epitaxial semiconductor material can contain dopant atoms therein.

Figure 8A:
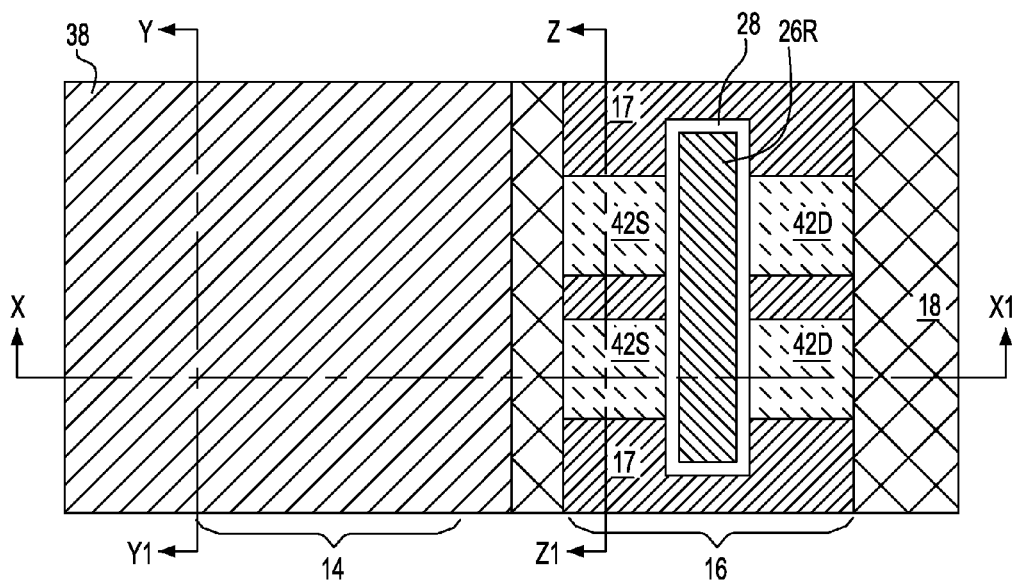
FIG. 8A is a top down view of the exemplary semiconductor structure of FIG. 7A after recessing exposed portions of each second semiconductor material portion in the nFET device region to provide recessed regions, and forming a second epitaxial semiconductor material within the recessed regions.
Figure 8B:
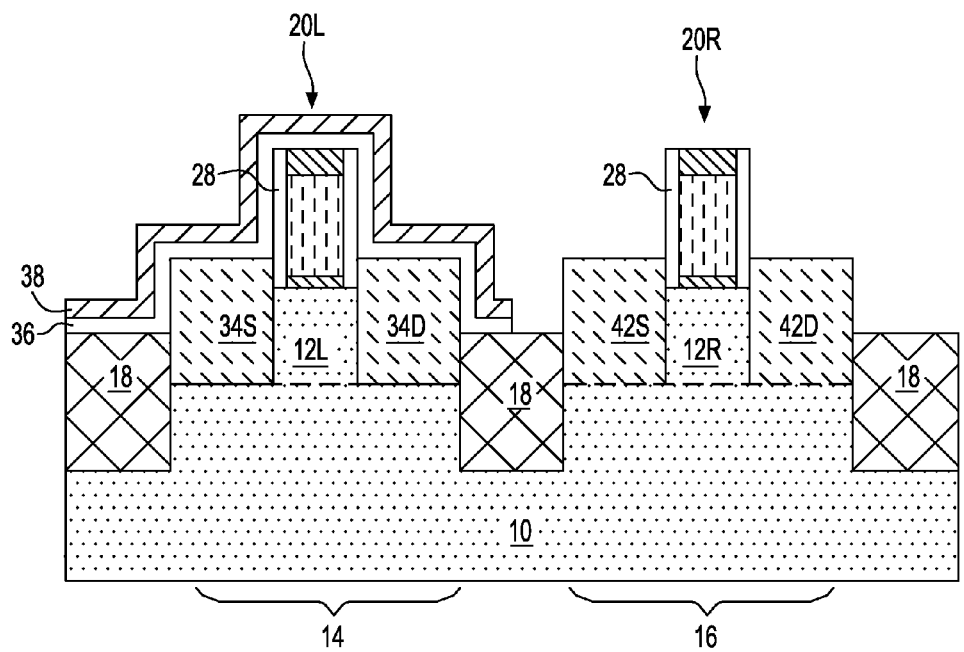
FIG. 8B is a cross sectional view of the exemplary semiconductor structure of FIG. 8A along vertical plane X-X1.
Figure 8C:
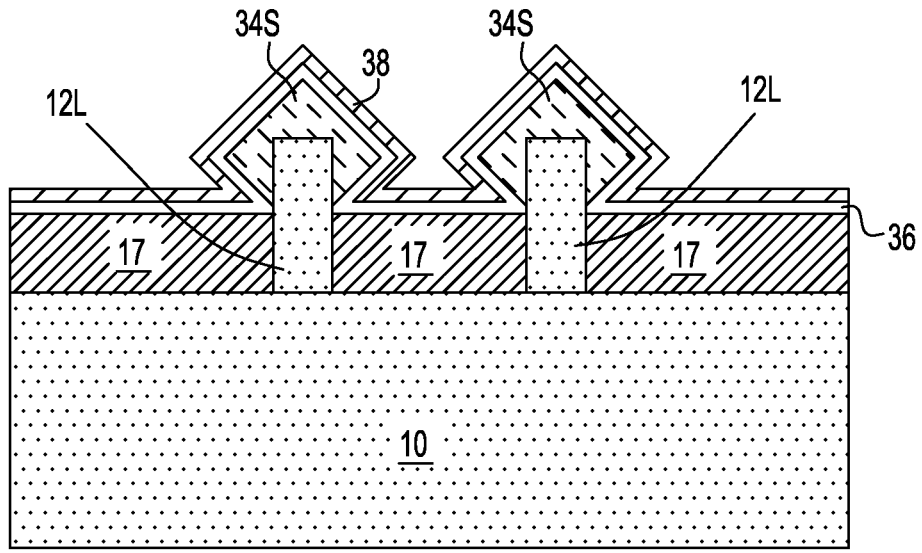
FIG. 8C is a cross sectional view of the exemplary semiconductor structure of FIG. 8A along vertical plane Y-Y1.
Figure 8D:
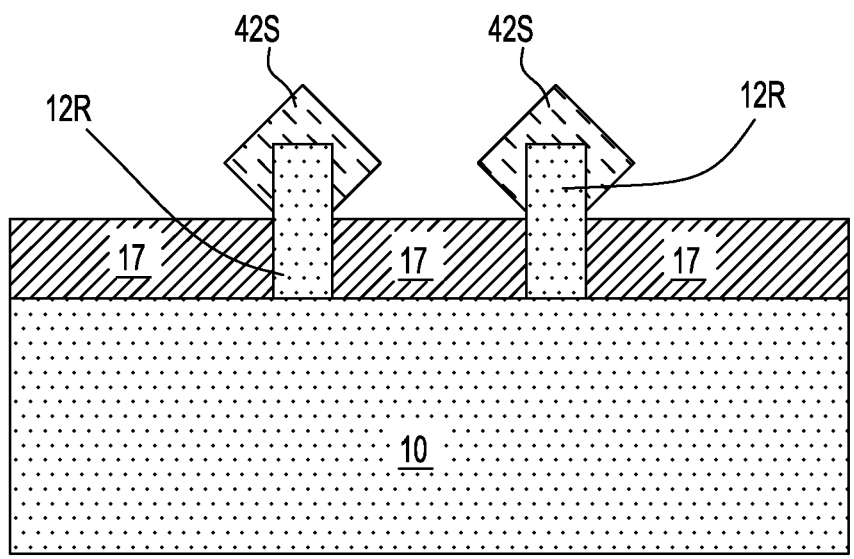
FIG. 8D is a cross sectional view of the exemplary semiconductor structure of FIG. 8A along vertical plane Z-Z1.

As is observed from the cross sectional view shown in FIG. 8D, the second epitaxial semiconductor material that provides the source region 42S forms on sidewall surfaces and on a topmost surface of each exposed second semiconductor material portion 12R. Also, and as shown in the drawings, each second epitaxial semiconductor material that is formed has a non-planar topmost surface. In some embodiments, a diamond shaped second epitaxial semiconductor material that provides the source region 42S is formed surrounding the exposed portions of each second semiconductor material portion 20L. Although not shown, the drain region 42 would look the same as the source region 42S.

After forming the second epitaxial semiconductor material that provides the source region 42S and drain region 42D, the another block mask 40 is removed from the pFET device region 14 providing the structure shown in FIGS. 8A-8D. The another block mask 40 can be removed utilizing one of the techniques mentioned above for removing block mask 32 from the nFET device region 16.

Figure 9A:
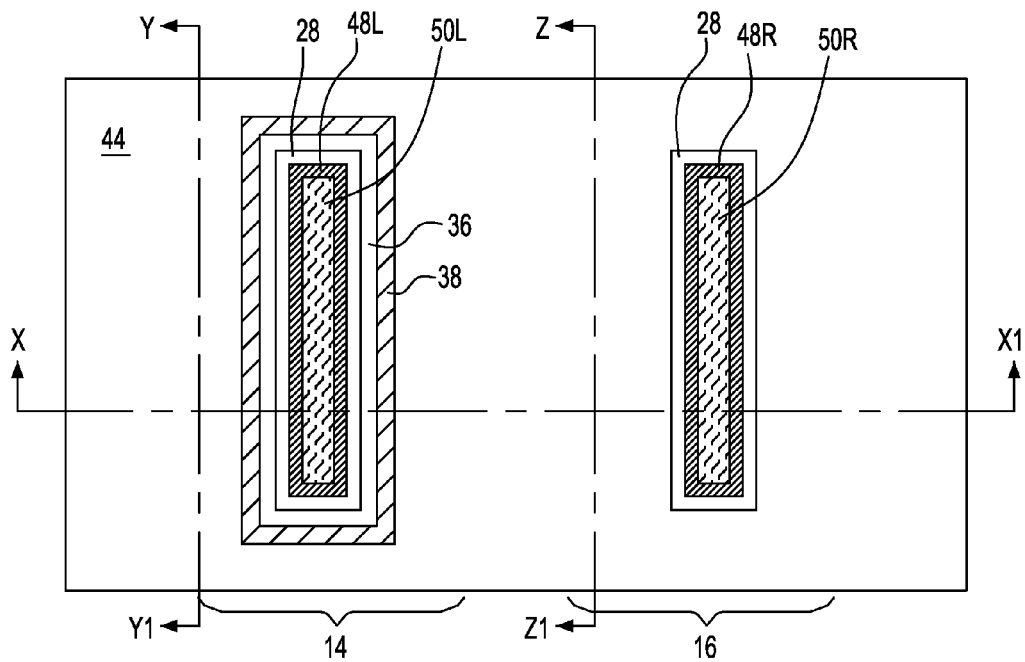
FIG. 9A is a top down view of the exemplary semiconductor structure of FIG. 8A after forming a planarizing dielectric material and then replacing each of the first sacrificial gate structures and each of the second sacrificial gate structures with first and second functional gate structures, respectively.
Figure 9B:
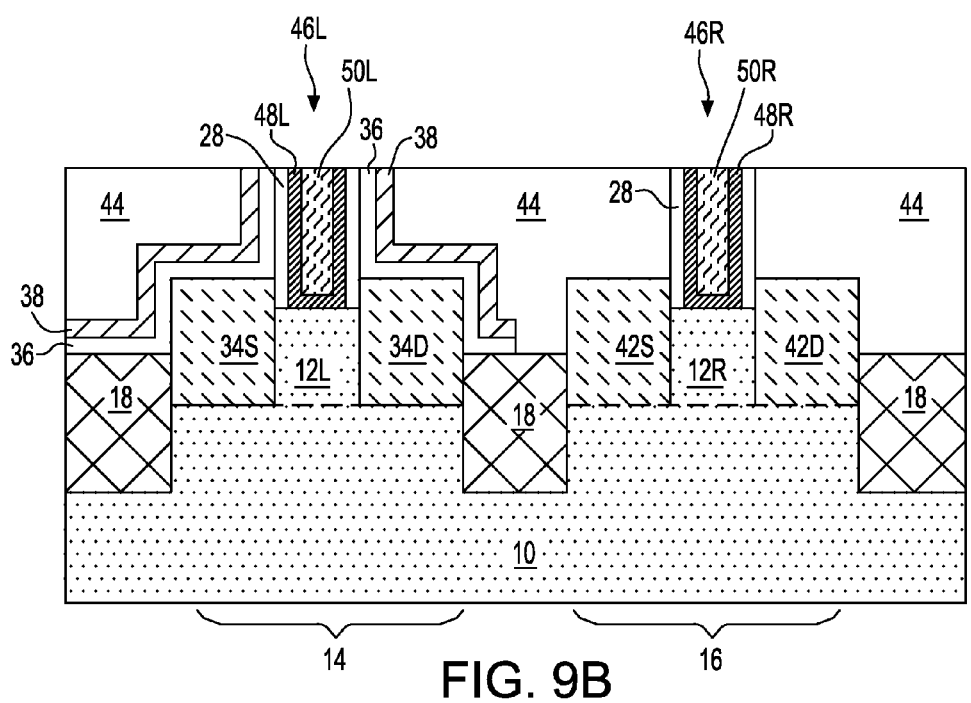
FIG. 9B is a cross sectional view of the exemplary semiconductor structure of FIG. 9A along vertical plane X-X1.

Referring now to FIGS. 9A-9B, there are illustrated the exemplary semiconductor structure of FIGS. 8A-8D after forming a planarizing dielectric material 44 and then replacing each of the first sacrificial gate structures 20L and second sacrificial gate structures 20R with first and second functional gate structures 46L 46R, respectively. The term "functional gate structure" is used throughout the present application as a permanent gate structure used to control output current (i.e., flow of carriers in the channel) of a semiconducting device through electrical or magnetic fields. The planarizing dielectric material 44 has an uppermost surface that is coplanar with an uppermost surface of each first and second sacrificial gate structure 20L, 20R. Thus, the uppermost surface of each sacrificial gate structure 20L, 20R is exposed immediately after forming the planarizing dielectric material 44.

In some embodiments, the planarizing dielectric material 44 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the planarizing dielectric material 44. The use of a self-planarizing dielectric material as planarizing dielectric material 44 may avoid the need to perform a subsequent planarizing step.

In one embodiment, the planarizing dielectric material 44 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as planarizing dielectric material 44, a planarization process or an etch back process follows the deposition of the planarizing dielectric material 44. The thickness of the planarizing dielectric material 44 that can be employed in the present application may vary depending on the type of dielectric material employed as well as the method that was employed in forming the same. In one embodiment, the planarizing dielectric material 44 has a thickness from 80 nm to 500 nm. Other thicknesses that are greater or lesser than the range provided above can also be used for the planarizing dielectric material 44.

After forming the planarizing dielectric material 44, the first and second first sacrificial gate structures 20L, 20R are replaced with first and second functional gate structures 46L 46R, respectively. The replacement of each first and second first sacrificial gate structures 20L, 20R begins by removing the first and second sacrificial gate structures 20L, 20R from the structure to form gate cavities in the area previously occupied by the first and second sacrificial gate structures 20L, 20R. Each first and second sacrificial gate structure 20L, 20R can be removed by etching. In one example, a reactive ion etch can be used to removal each first and second sacrificial gate structures 20L, 20R.

The replacement process continues by forming a gate dielectric portion 48L, 48R and a gate conductor portion 50L, 50R within each gate cavity. The gate dielectric portion 48L and the gate conductor portion 50L provide a first functional gate structure 46L, while the gate dielectric portion 48R and the gate conductor portion 50R provide a second functional gate structure 46R. As is shown, a topmost surface of each first and second functional gate structure 46L, 46R is coplanar with a topmost surface of the planarizing dielectric material 44.

In some embodiments and as shown in the drawings, the gate dielectric portion 48L, 48R is U-shaped having a bottommost portion in direct contact with an uppermost surface of a respective semiconductor material portion and vertical portions that are located on exposed sidewalls of each dielectric spacer 28. Within each gate cavity, the gate dielectric portion 48L, 48R surrounds the gate conductor portion 50L, 50R. In another embodiment, the gate dielectric portion 48L, 48R is not U-shaped and thus lacks the vertical portions mentioned. In such an embodiment, the gate conductor portion that is formed atop the non-U-shaped gate dielectric fills the remaining portion of the gate cavity and has outermost edges that directly contact a sidewall surface of each dielectric spacer 28.

Each gate dielectric portion 48L, 48R may comprise any gate dielectric material. In one embodiment of the present application, gate dielectric portion 48L may comprise a same gate dielectric material as gate dielectric portion 48R. In another embodiment of the present application, gate dielectric portion 48L may comprise a different gate dielectric material as gate dielectric portion 48R. The gate dielectric material that provides each gate dielectric portion 48L, 48R can be an oxide, nitride, and/or oxynitride. In one example, the gate dielectric material that provides each gate dielectric portion 48L, 48R can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed.

The gate dielectric material used in providing each gate dielectric portion 48L, 48R can be formed by any deposition technique including, for example, chemical vapor deposition (CVD), plasma enhanced chemical vapor deposition (PECVD), physical vapor deposition (PVD), sputtering, or atomic layer deposition. In some embodiments, a thermal process including, for example, thermal oxidation and/or thermal nitridation may be used in forming each gate dielectric portion 48L, 48R. When a different gate dielectric material is used for the gate dielectric portion 48L, 48R, block mask technology can be used. In one embodiment of the present application, the gate dielectric material used in providing each gate dielectric portion 48L, 48R can have a thickness in a range from 1 nm to 10 nm. Other thicknesses that are lesser than or greater than the aforementioned thickness range can also be employed for the gate dielectric material.

Each gate conductor portion 50L, 50R may comprise a gate conductor material. In one embodiment of the present application, gate conductor portion 50L may comprise a same gate conductor material as gate conductor portion 50R. In another embodiment of the present application, gate conductor portion 50L may comprise a different gate conductor material as gate conductor portion 50R. The gate conductor material used in providing each gate conductor portion 50L, 50R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion 50L may comprise a pFET gate metal. In other embodiments, gate conductor portion 50R may comprise an nFET gate metal. In yet a further embodiment, each gate conductor portion 50L, 50R may comprise a gate conductor stack of a work-function metal and a gate metal.

The gate conductor material used in providing each gate conductor portion 50L, 50R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portion 50L, 50R, block mask technology can be used. In one embodiment, the gate conductor material used in providing each gate conductor portion 50L, 50R has a thickness from 1 nm to 100 nm. Other thicknesses that are lesser than or greater than the aforementioned thickness range can also be employed for the gate conductor material used in providing each gate conductor portion 50L, 50R.

Figure 10A:
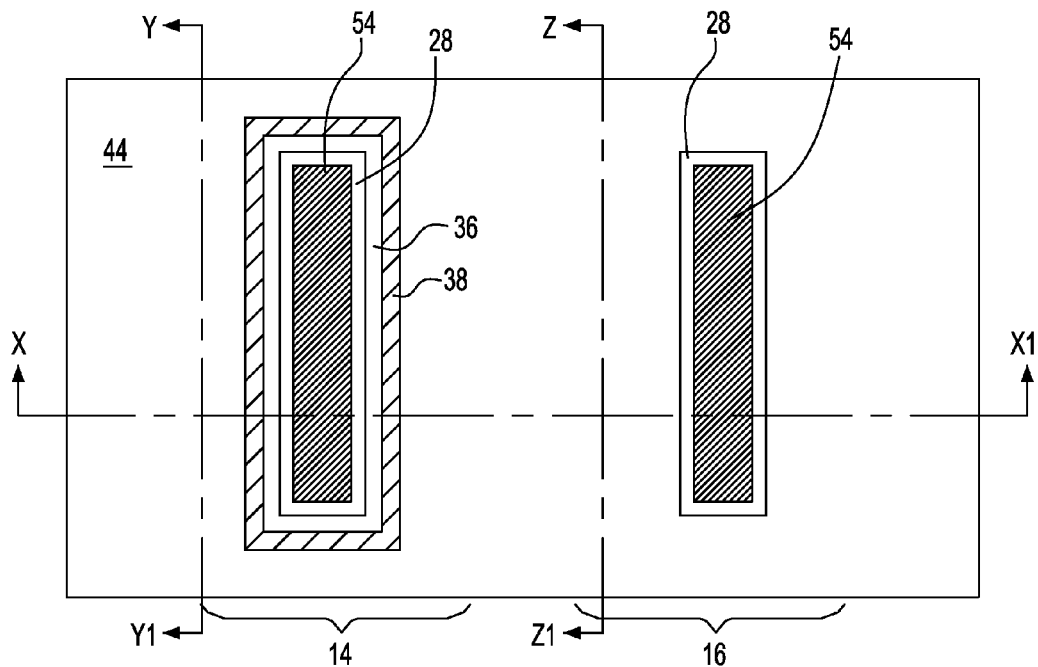
FIG. 10A is a top down view of the exemplary semiconductor structure of FIG. 9A after recessing the first and second functional gate structures and formation of a contact metal and a dielectric cap within the recessed regions created by removing an upper portion of each functional gate structure.
Figure 10B:
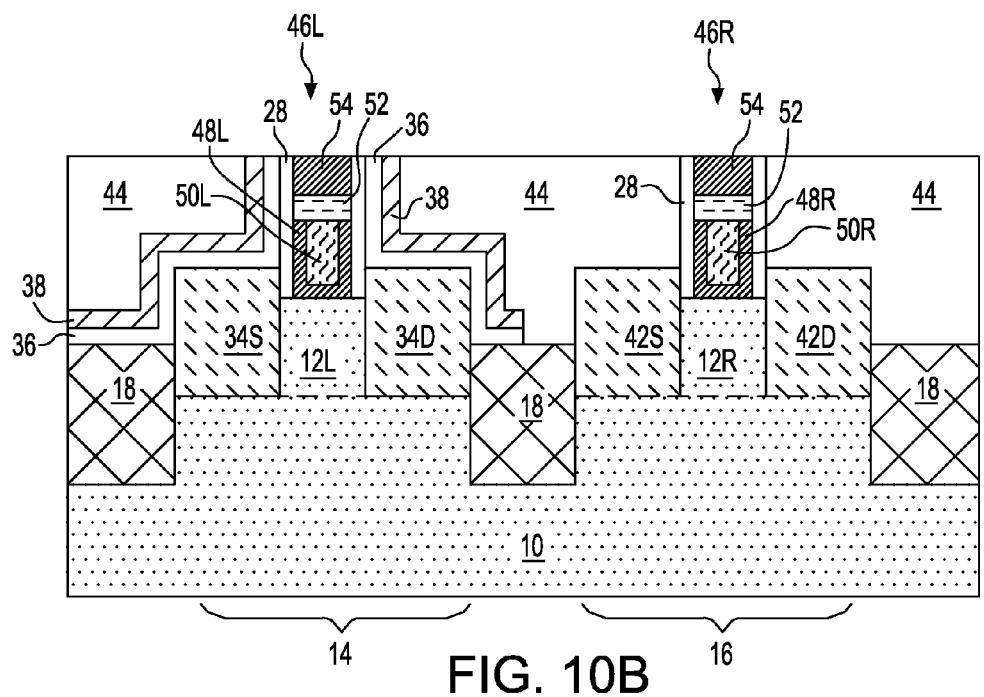
FIG. 10B is a cross sectional view of the exemplary semiconductor structure of FIG. 10A along vertical plane X-X1.

Referring now to FIGS. 10A-10B, there is illustrated the exemplary semiconductor structure of FIGS. 9A-9B after recessing the first and second functional gate structures 46L, 46R and forming a contact metal 52 and a dielectric cap 54 within the recessed regions created by removing an upper portion of each functional gate structure 46L, 46R. In some embodiments of the present application, this step can be omitted and the process can proceed as described herein below.

In embodiments in which the recessing of the first and second functional gate structures 46L, 46R and forming the contact metal 52 and the dielectric cap 54, the dielectric cap 54 has a topmost surface that is coplanar with a topmost surface of the planarizing dielectric material 44. Also, a bottommost surface of the dielectric cap 54 forms and interface with a topmost surface of the contact metal 52. Furthermore, sidewall surfaces of the dielectric cap 54, and the contact metal 52 contact an upper portion of a sidewall surface of the dielectric spacer 28 and the sidewall surfaces of the dielectric cap 54 and the contact material 52 are vertical coincident to a sidewall surface of a remaining portion of the gate dielectric material portion 48L, 48R.

The recessing of the first and second functional gate structures 46L, 46R includes a anisotropic etching process such as, for example, reactive ion etching. The etch reduces the height of each functional gate structures 46L, 46R below the height of the dielectric spacer 28. After performing the etch to recess the functional gate structures, the metal contact 52 can be formed on the topmost surfaces of the each gate dielectric material portion 48L, 48R and each gate conductor portion 50L, 50R. The metal contact 52 can include any contact metal such as, for example, W, Cu, Al or alloys thereof. The contact metal can formed utilizing any deposition process including those mentioned above in forming the gate conductor portions 50L, 50R. After deposition of the contact metal, a recess etch may be performed prior to forming the dielectric cap 54. The metal contact 52 can have a thickness of from 10 nm to 50 nm. Other thicknesses can also be used for the thickness of the metal contact 52.

The dielectric cap 54 includes a dielectric material such as for example, silicon dioxide, silicon nitride and/or silicon oxynitride. The dielectric cap 54 can be formed by a deposition process including, for example, chemical vapor deposition, and plasma enhanced chemical vapor deposition. The dielectric cap 54 can have a thickness from 1 to 20 nm. Other thicknesses can also be used for the thickness of the dielectric cap 54.

Figure 11A:
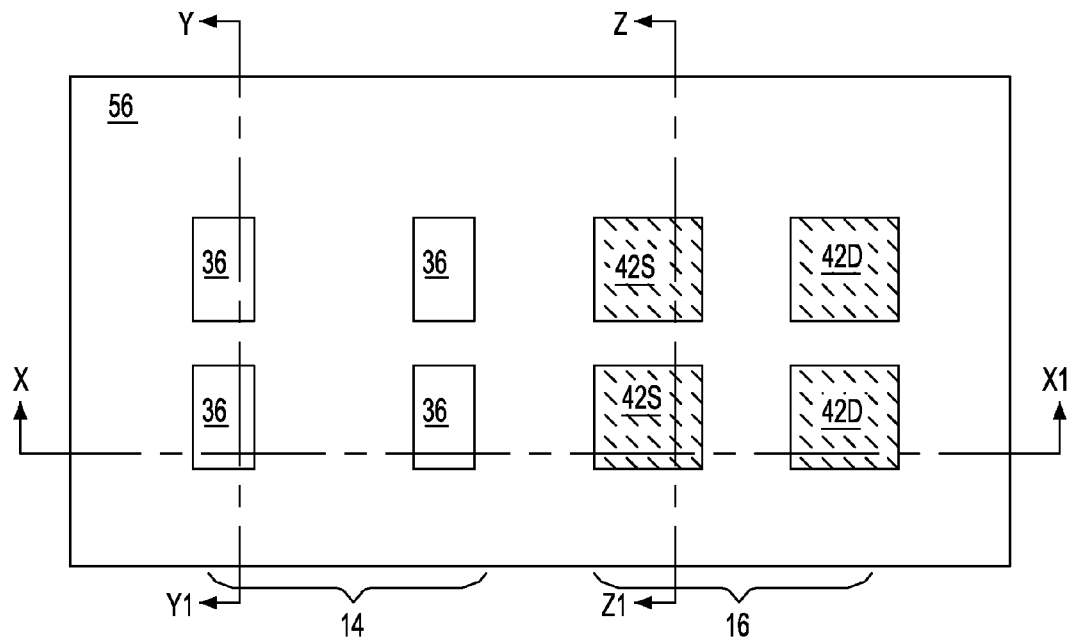
FIG. 11A is a top down view of the exemplary semiconductor structure of FIG. 10A after forming an optional dielectric material and forming source/drain contact openings within the optional dielectric material and planarizing dielectric material.
Figure 11B:
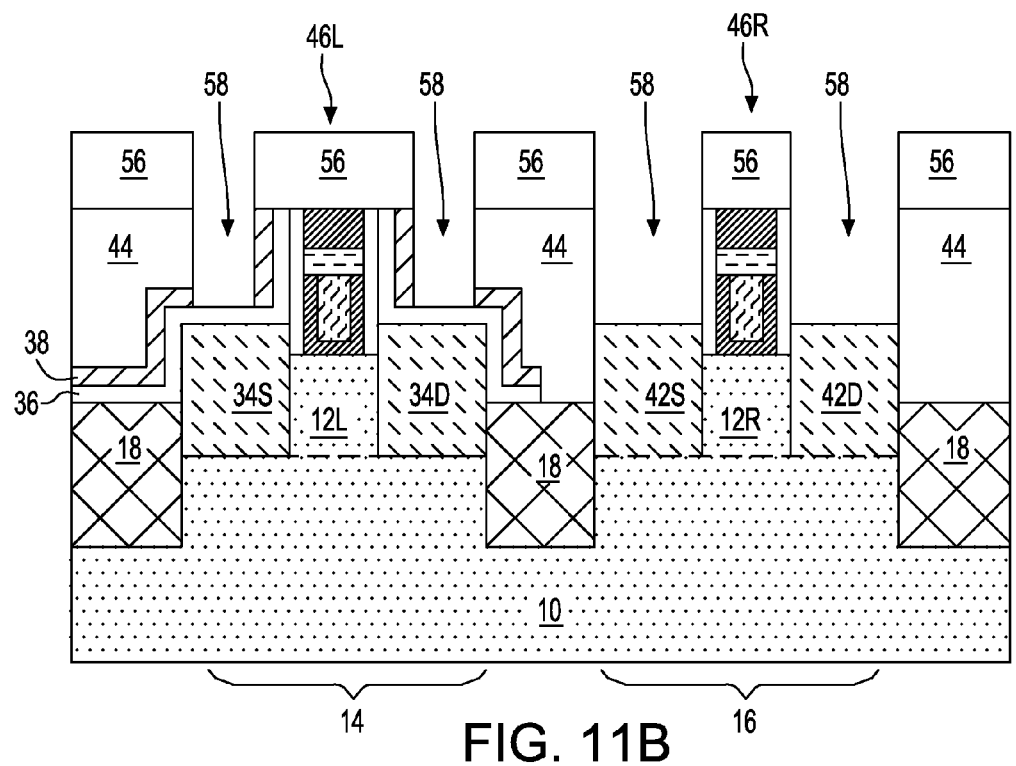
FIG. 11B is a cross sectional view of the exemplary semiconductor structure of FIG. 11A along vertical plane X-X1.

Referring now to FIGS. 11A-11B, there are illustrated the exemplary semiconductor structure of FIG. 10A after forming an optional dielectric material 56 and forming source/drain contact openings 58 within the optional dielectric material 54 and planarizing dielectric material 44. The optional dielectric material 56 may include one of the dielectric materials mentioned above for providing the planarizing dielectric material 44. In one embodiment, the optional dielectric material 56 may comprise a different dielectric material than the planarizing dielectric material 44. In other embodiment, the optional dielectric material 56 may comprise a same dielectric material as the planarizing dielectric material 44. The optional dielectric material 56 can be formed utilizing one of the deposition process mentioned above in forming the planarizing dielectric material 44.

The source/drain contact openings 58 can be formed by lithography and etching. In the pFET device region 14, the etch stops on the topmost surface of the high k dielectric layer 36 that is located atop the first epitaxial semiconductor material that provides the source region 34S and the drain region 34D. In the nFET device region, the etch stops of the topmost surface of the second epitaxial semiconductor material that provides the source region 42S and drain region 42D.

Figure 12A:
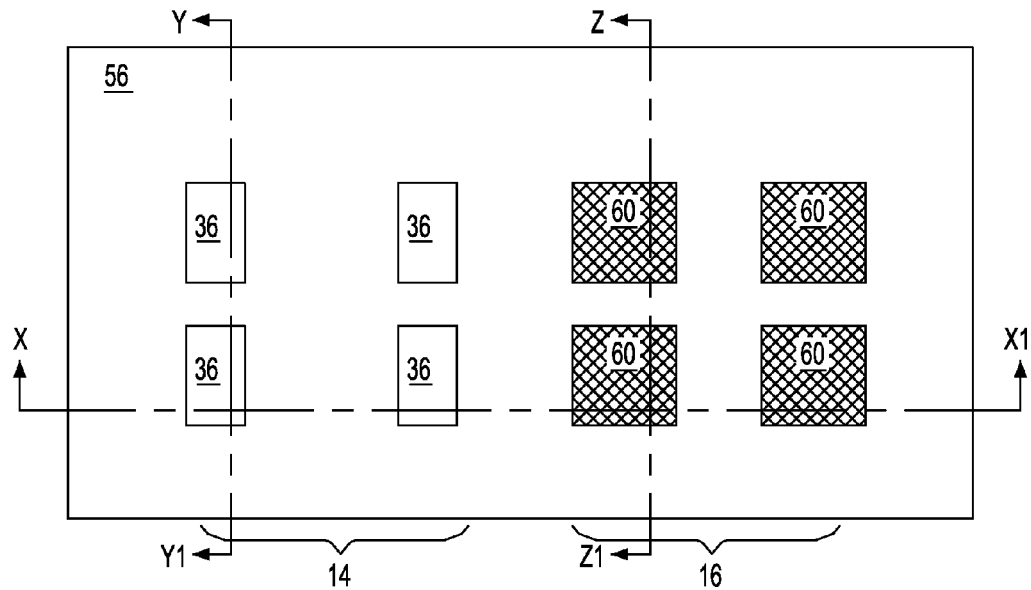
FIG. 12A is a top down view of the exemplary semiconductor structure of FIG. 11A after performing an amorphization ion implant process and encapsulating the second epitaxial semiconductor material with a layer of a dipole metal or a metal-insulator-semiconductor (MIS) oxide.
Figure 12B:
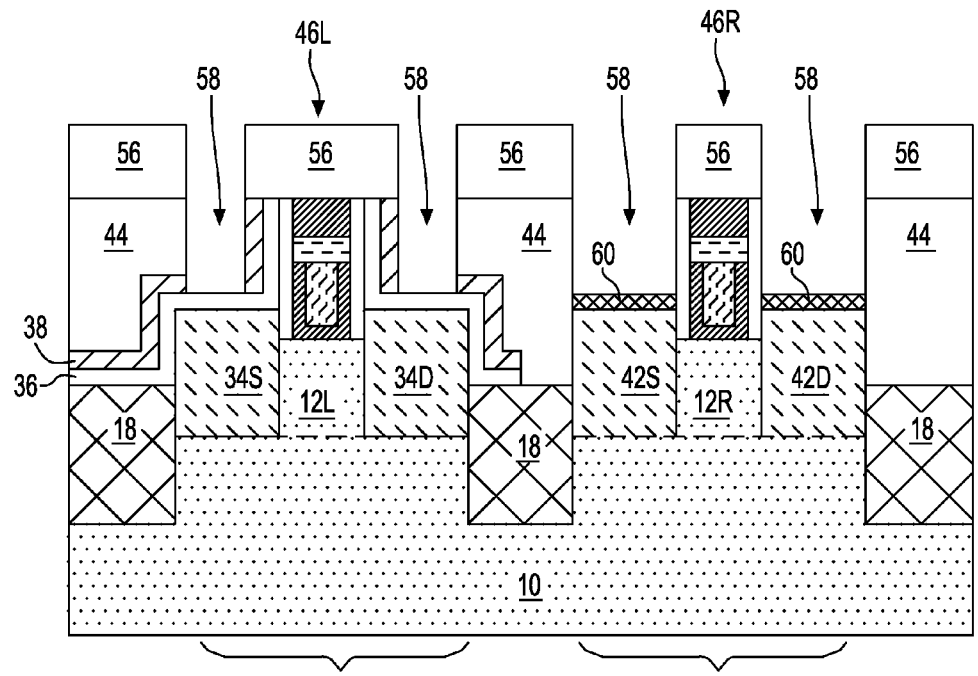
FIG. 12B is a cross sectional view of the exemplary semiconductor structure of FIG. 12A along vertical plane X-X1.
Figure 13A:
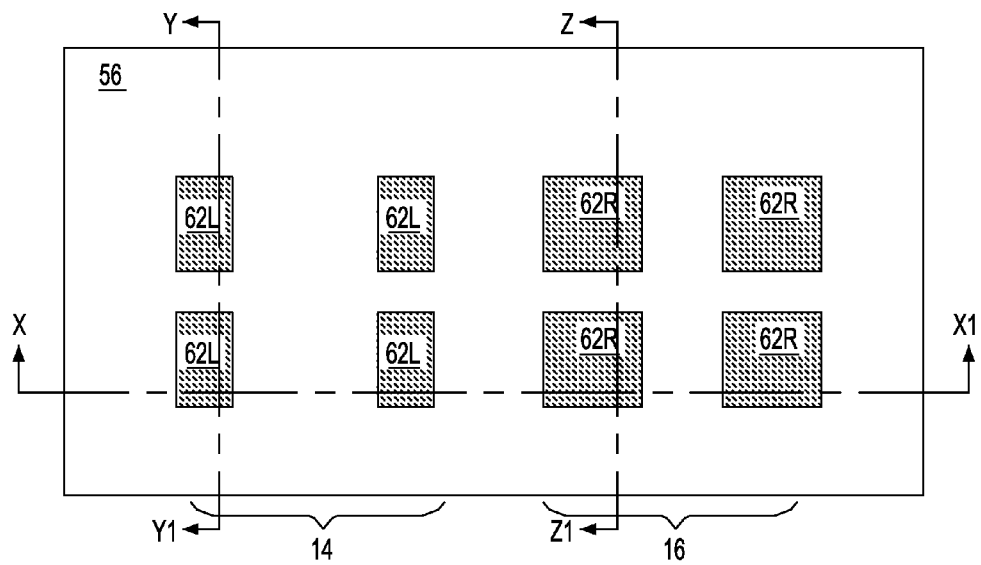
FIG. 13A is a top down view of the exemplary semiconductor structure of FIG. 12A after removing the high k dielectric layer from the first epitaxial semiconductor material, and forming a metal semiconductor alloy atop each of the first epitaxial semiconductor material and the second epitaxial semiconductor material.
Figure 13B:
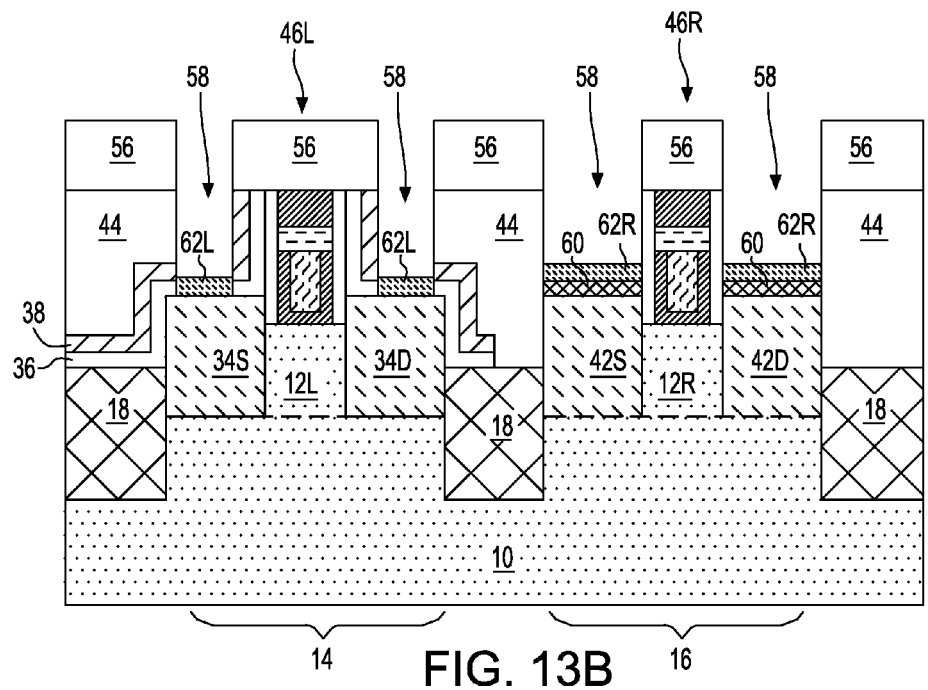
FIG. 13B is a cross sectional view of the exemplary semiconductor structure of FIG. 13A along vertical plane X-X1.
Figure 13C:
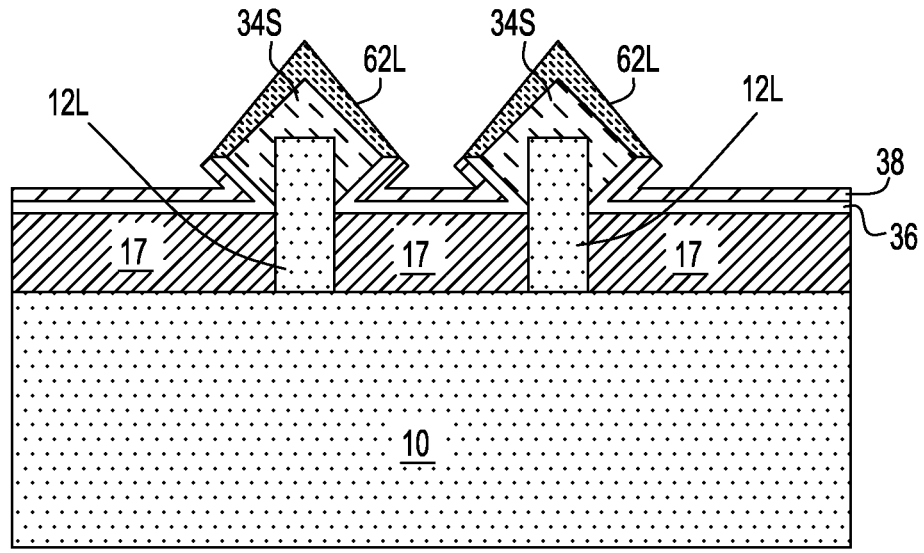
FIG. 13C is a cross sectional view of the exemplary semiconductor structure of FIG. 13A along vertical plane Y-Y1.
Figure 13D:
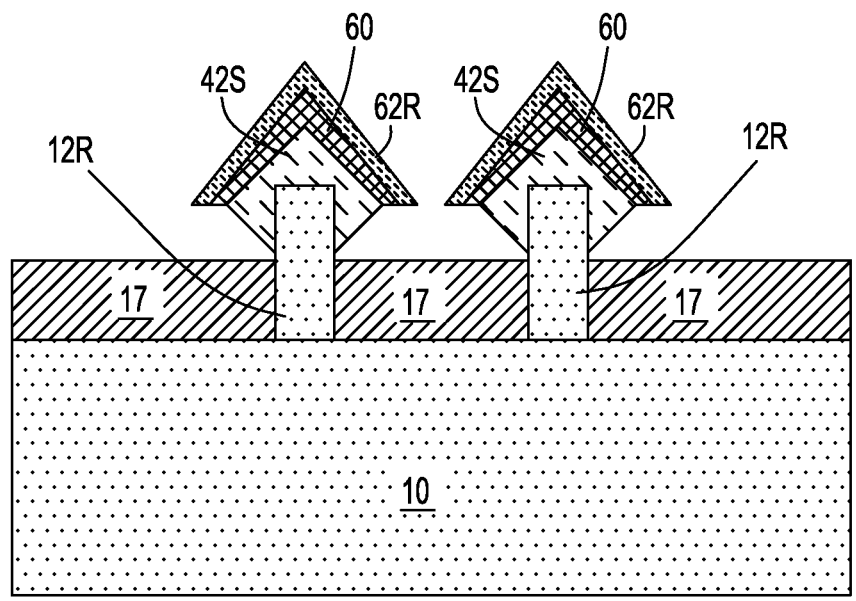
FIG. 13D is a cross sectional view of the exemplary semiconductor structure of FIG. 13A along vertical plane Z-Z1.

Referring now to FIGS. 12A-12B, there are illustrated the exemplary semiconductor structure of FIGS. 11A-11B after performing an amorphization ion implant process and encapsulating the second epitaxial semiconductor material with a layer 60 of a dipole metal or a metal-insulator-semiconductor (MIS) oxide. The amorphization ion implant is performed into the first and second epitaxial semiconductor materials (34S, 34D, 42S and 42D) to form amorphized semiconductor regions (not shown) in an upper portion of each of the first and second epitaxial semiconductor materials (34S, 34D, 42S and 42D). The implant allows for the subsequent formation of metal semiconductor alloy of different thicknesses in the pFET device region 14 and the nFET device region 16. In one embodiment of the present application, the amorphization implant includes implantation of germanium atoms into the first and second epitaxial semiconductor materials (34S, 34D, 42S and 42D). The conditions of the amorphization implant can include 1 KeV-2 MeV to a dose of 1E14-5E15 Si+cm$^{-2}$.

Following the amorphization ion implant, a layer 60 of a dipole metal or a metal-insulator-semiconductor (MIS) oxide is formed on the exposed surfaces of the second semiconductor material (42S, 42D) within the source/drain contact openings 58 in the nFET device region 16. No dipole metal or a metal-insulator-semiconductor (MIS) oxide forms on the exposed portions of the high k dielectric layer 36 within the pFET device region 14.

In one embodiment, layer 60 is composed of a dipole metal. By "dipole metal" it is meant any metal that the wave functions of electrons in the metal penetrate into the semiconductor forming metal-induced gap states (MIGS), which form a static dipole layer at the interface. This layer causes the barrier height to vary approximately linearly with electric field. Examples of dipole metals that can be employed as layer 60 include, for example, Y, Er, Al, W, Ti, Hf, Zr, Zn, Be, La, Dy, Ye, Gd, Er, Yb and multilayers thereof. The dipole metal can be formed by a deposition process including one of the deposition process mentioned above in forming the gate conductor material.

In another embodiment, layer 60 is composed of a metal-insulator-semiconductor (MIS) oxide. Examples of MIS oxides that can be employed as layer 60 include $SiO_xN_y$, $GeO_x$, $AlO_x$, $Ge_3N_4$, $TiO_2$, $HfO_2$, $ZrO_2$, ZnO. $Be_xO_y$, $La_xO_y$, $Dy_xO_y$, $Ye_xO_y$, $Gd_xO_y$, $Er_xO_y$, $Yb_xO_y$, and multilayers thereof, wherein x and y are a content of a fraction. The MIS oxide can be formed by utilizing a deposition process such as, for example, chemical vapor deposition, and sputtering.

Notwithstanding whether a dipole metal or a MIS oxide is employed as layer 60, layer 60 has a thickness from 0.1 nm to 2 nm. Other thicknesses can also be used as the thickness for layer 60.

Referring now FIGS. 13A-13D, there are illustrated the exemplary semiconductor structure of FIGS. 12A-12B after removing the high k dielectric layer 36 from the first epitaxial semiconductor material (i.e., source/drain regions 34S, 34D), and forming a metal semiconductor alloy 62L, 62R atop each of the first epitaxial semiconductor material (i.e., the source/drain regions 34S, 34D) and the second epitaxial semiconductor material (i.e., the source/drain regions 42S, 42D).

The high k dielectric layer 36 can be removed from the surface of the first epitaxial semiconductor material (i.e., the source/drain regions 34S, 34D) utilizing an etching process that is selective in removing the high k material. Next, a metal semiconductor alloy forming metal (not specifically shown) is formed directly on the exposed portions of the first epitaxial semiconductor material (i.e., the source/drain regions 34S, 34D) and directly on the layer 60 of dipole metal or MIS oxide that is located on the second epitaxial semiconductor material. The term "metal semiconductor alloy forming metal" is used throughout the present application to denote a metal that can react with an underlying semiconductor material to form a metal semiconductor alloy. Illustrative examples of metal semiconductor alloy forming metals that can be used in the present application include at least one of nickel (Ni), platinum (Pt), palladium (Pd), titanium (Ti), tungsten (W), and cobalt (Co). The metal semiconductor alloy forming metal can be formed by a deposition process including, for example, chemical vapor deposition, plasma enhanced chemical vapor deposition, plating or sputtering. In some embodiments, a co-deposition of metal semiconductor alloy forming metals can be used. In another embodiment, a first metal semiconductor alloy forming metal can be formed, followed by a second metal semiconductor alloy forming metal. The metal semiconductor alloy metal that is formed can have a thickness from 5 to 15 nm. Other thicknesses that are greater than or lesser than the aforementioned thickness range can also be employed as the thickness of the metal semiconductor alloy forming metal.

After providing the metal semiconductor alloy forming metal and in some embodiments of the present application, a diffusion barrier (not shown) can be formed on an exposed upper surface of the metal semiconductor alloy forming metal. In another embodiment of the present application, no diffusion barrier is provided on the exposed upper surface of the metal semiconductor alloy forming metal. When present, the diffusion barrier can include a metal nitride such as, for example, TiN or TaN, and any deposition process including those mentioned above for providing the metal semiconductor alloy forming metal may be used. When present, the diffusion barrier can have a thickness from 1 nm to 20 nm.

Next, an anneal is performed under conditions that are effective in causing the metal semiconductor alloy forming metal to form the metal semiconductor alloy 62L, 62R, i.e., source-side and drain-side metal semiconductor alloy contacts. The metal semiconductor alloy formation anneal may be performed in a single step or a two-step anneal can be used. In one embodiment and when nickel is used, the metal semiconductor alloy formation anneal can be performed at a temperature of from 200° C. to 500° C. In another embodiment, temperatures greater than 500° C. can be used. The metal semiconductor alloy formation anneal is typically performed in an ambient including, for example, argon, helium, neon and/or nitrogen. The metal semiconductor alloy formation anneal can be performed utilizing a rapid thermal anneal, a spike anneal, a microwave anneal or a laser anneal. Following the metal semiconductor alloy formation anneal, the optional diffusion barrier and any unreacted metal semiconductor alloy forming metal can be removed utilizing one or more etch processes.

In this embodiment of the present application, the metal semiconductor alloy 62L is formed directly on an exposed surface of the first epitaxial semiconductor material (i.e., the source/drain regions 34S, 34D) within the nFET device region 14, while the metal semiconductor alloy 62R is formed directly on an exposed surface of the layer 60 in the pFET device region 16.

Figure 14A:
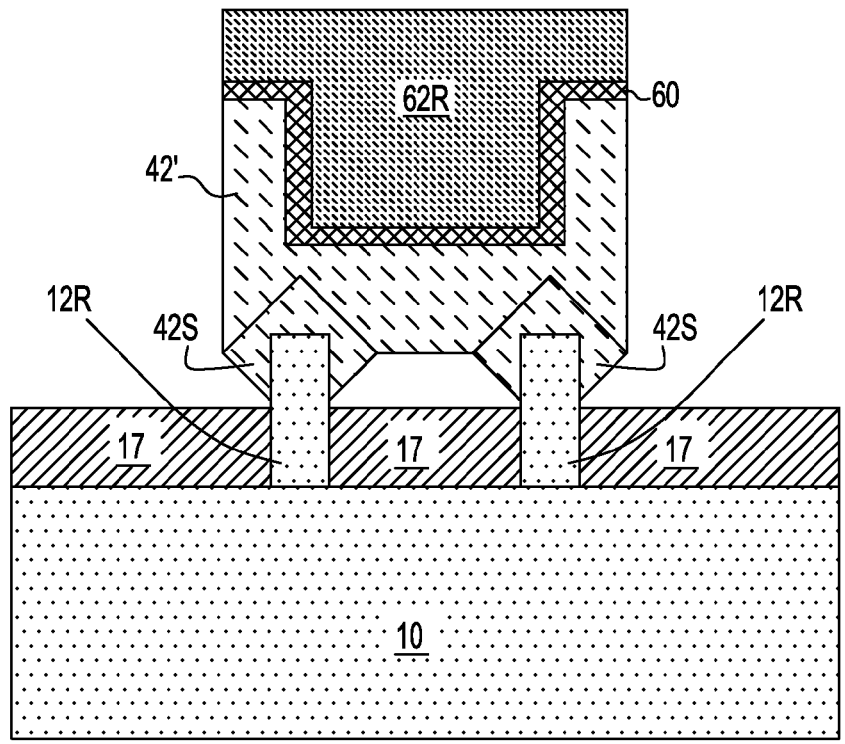
FIGS. 14A and 14B illustrate alternative embodiments of the present application in which an additional second epitaxial semiconductor material is formed within the nFET device region and is patterned prior to amorphization and metal semiconductor alloy formation.
Figure 14B:
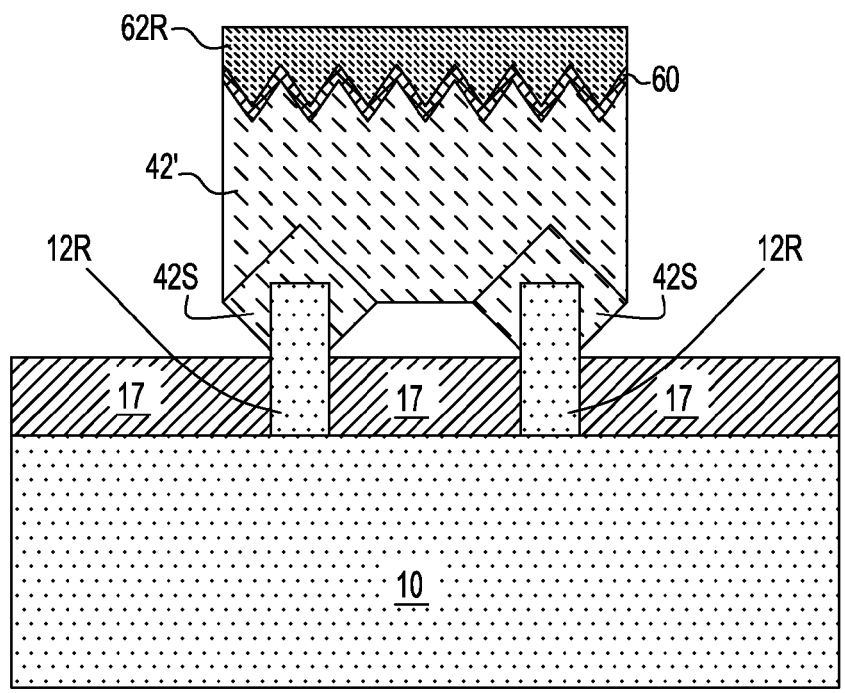

Referring now to FIGS. 14A and 14B, there are illustrated alternative embodiments of the present application in which an additional second epitaxial semiconductor material 44' is formed within the nFET device region 16 and is patterned prior to amorphization and metal semiconductor alloy formation 62R.

In FIG. 14A, the additional second epitaxial semiconductor material 42' is patterned to include a single opening therein. Such a structure can be formed by first providing the structure shown in FIGS. 11A-11B, and then forming the additional second epitaxial semiconductor material 42'. A block mask can be formed protecting the pFET device region 14 during the formation of the patterned additional second epitaxial semiconductor material. The additional second epitaxial semiconductor material 42' is comprised of a same semiconductor material as the second epitaxial semiconductor material and one of the epitaxial deposition processes mentioned above in forming the second epitaxial semiconductor material that provides the source/drain regions 42S/42D can be used in forming the additional second epitaxial semiconductor material 42'. The additional second epitaxial semiconductor material 42' is then patterned by lithographic and etching. After formation of the pattern into the additional second epitaxial semiconductor material 42', the process continues as described above in FIGS. 12A-13D.

In FIG. 14B, the additional second epitaxial semiconductor material 42' is patterned to include a saw-tooth pattern. Such a structure can be formed by first providing the structure shown in FIGS. 11A-11B, and then forming the additional second epitaxial semiconductor material 42'. A block mask can be formed protecting the pFET device region 14 during the formation of the patterned additional second epitaxial semiconductor material. The additional second epitaxial semiconductor material 42' is comprised of a same semiconductor material as the second epitaxial semiconductor material and one of the epitaxial deposition processes mentioned above in forming the second epitaxial semiconductor material that provides the source/drain regions 42S, 42D can be used in forming the additional second epitaxial semiconductor material 42'. The additional second epitaxial semiconductor material 42' is then patterned by a crystallographic wet etch process such as, for example, anisotropic TMAH (tetramethylammonium hydroxide) etching, EDP orientation-dependent etching, various combinations of HF, $HNO_3$, $H_2O$ or $CH_3COOH$, and various combinations of HF, $HNO_3$, $CH_3COOH$. After formation of the pattern into the additional second epitaxial semiconductor material 42', the process continues as described above in FIGS. 12A-13D.

Figure 15A:
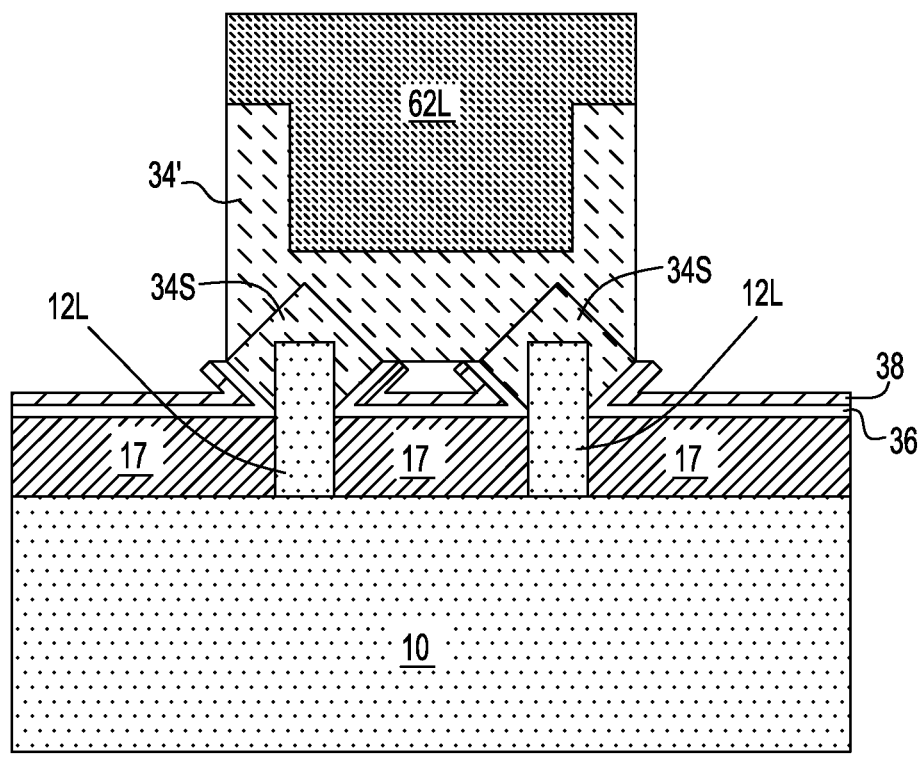
FIGS. 15A and 15B illustrate alternative embodiments of the present application in which an additional first epitaxial semiconductor material is formed within the pFET device region and is patterned after high k dielectric layer removal and metal semiconductor alloy formation.
Figure 15B:
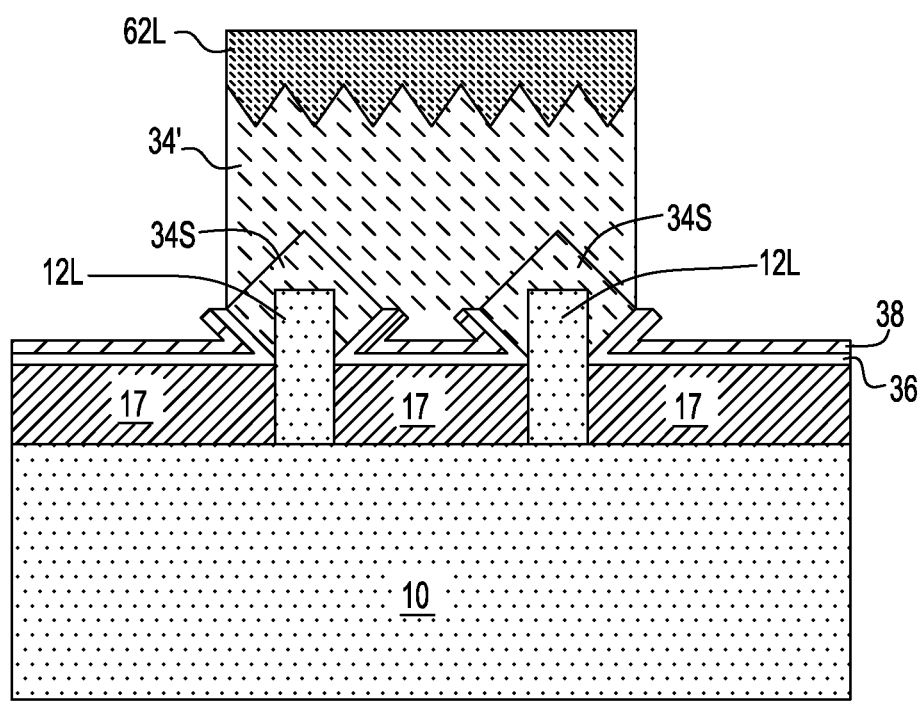

Referring now to FIGS. 15A and 15B, there are illustrated alternative embodiments of the present application in which an additional first epitaxial semiconductor material 34' is formed within the pFET device region 14 and is patterned after high k dielectric layer 36 removal and metal semiconductor alloy formation 62L.

In FIG. 15A, the additional first epitaxial semiconductor material 34' is patterned to include a single opening therein. Such a structure can be formed by first providing the structure shown in FIGS. 11A-11B, and then forming the additional first epitaxial semiconductor material 34'. A block mask can be formed protecting the nFET device region 16 during the formation of the patterned additional first epitaxial semiconductor material. The additional first epitaxial semiconductor material 34' is comprised of a same semiconductor material as the first epitaxial semiconductor material and one of the epitaxial deposition processes mentioned above in forming the first epitaxial semiconductor material that provides the source/drain regions 34S/34D can be used in forming the additional first epitaxial semiconductor material 34'. The additional first epitaxial semiconductor material 34' is then patterned by lithographic and etching. After formation of the pattern into the additional first epitaxial semiconductor material 34', the process continues as described above in FIGS. 12A-13D.

In FIG. 14B, the additional first epitaxial semiconductor material 34' is patterned to include a saw-tooth pattern. Such a structure can be formed by first providing the structure shown in FIGS. 11A-11B, and then forming the additional first epitaxial semiconductor material 34'. A block mask can be formed protecting the nFET device region 16 during the formation of the patterned additional first epitaxial semiconductor material. The additional first epitaxial semiconductor material 34' is comprised of a same semiconductor material as the first epitaxial semiconductor material and one of the epitaxial deposition processes mentioned above in forming the first epitaxial semiconductor material that provides the source/drain regions 34S, 34D can be used in forming the additional first epitaxial semiconductor material 34'. The additional first epitaxial semiconductor material 34' is then patterned by a crystallographic wet etch process such as, for example, anisotropic TMAH (tetramethylammonium hydroxide) etching, EDP orientation-dependent etching, various combinations of HF, $HNO_3$, $H_2O$ or $CH_3COOH$, and various combinations of HF, $HNO_3$, $CH_3COOH$. After formation of the pattern into the additional first epitaxial semiconductor material 34', the process continues as described above in FIGS. 12A-13D.

The formation of additional epitaxial semiconductor material and patterning the same may be formed in the pFET device region 14 and/or the nFET device region 16.

Figure 16A:
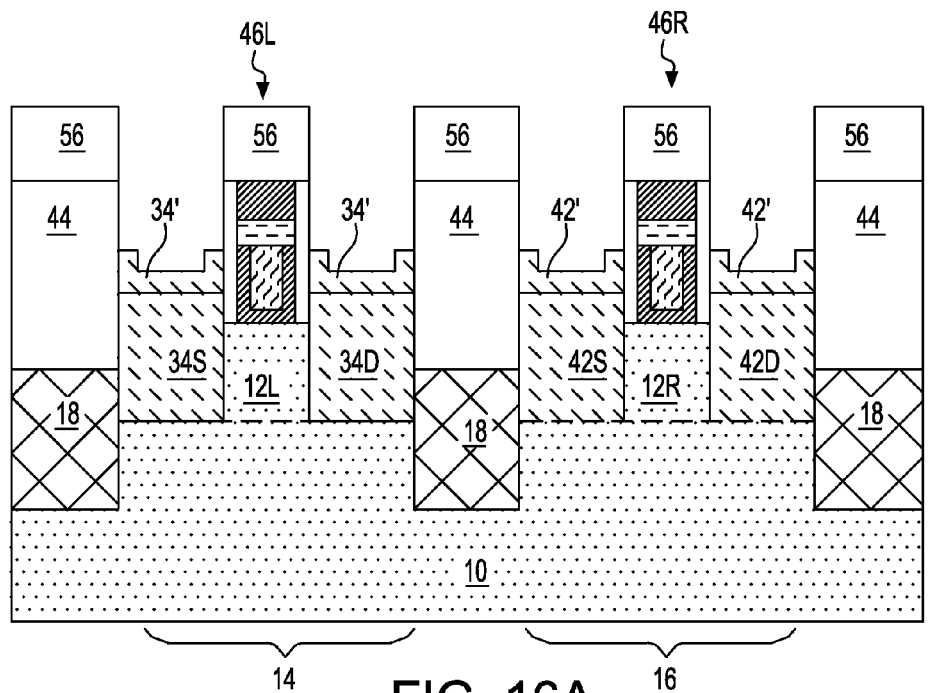
FIGS. 16A, 16B, 16C and 16D illustrate other alternative embodiments of the present invention in which the source and drain regions are made larger.
Figure 16B:
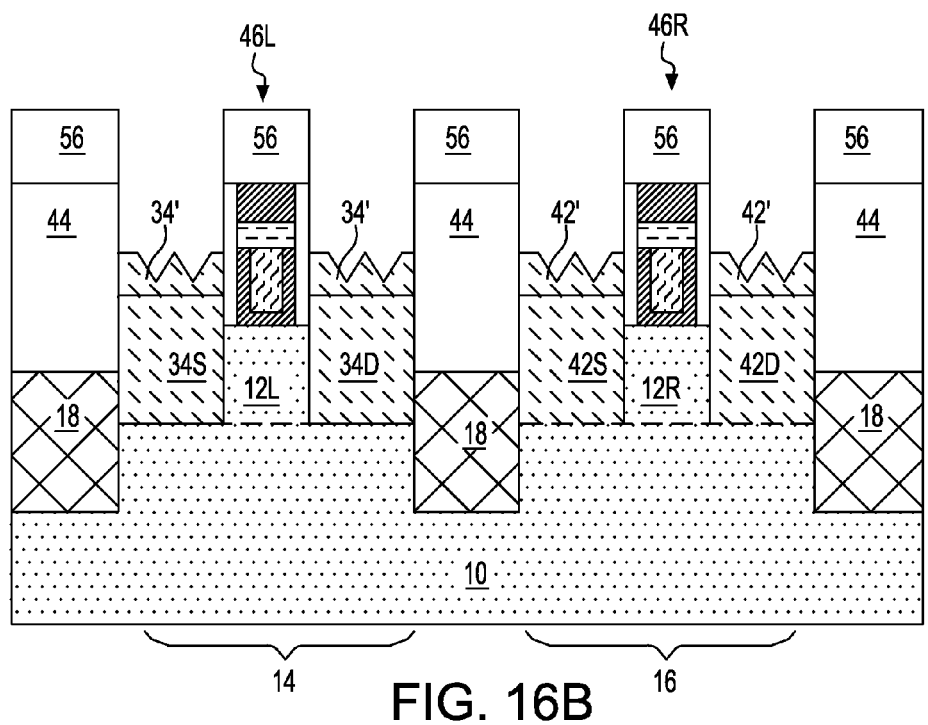
Figure 16C:
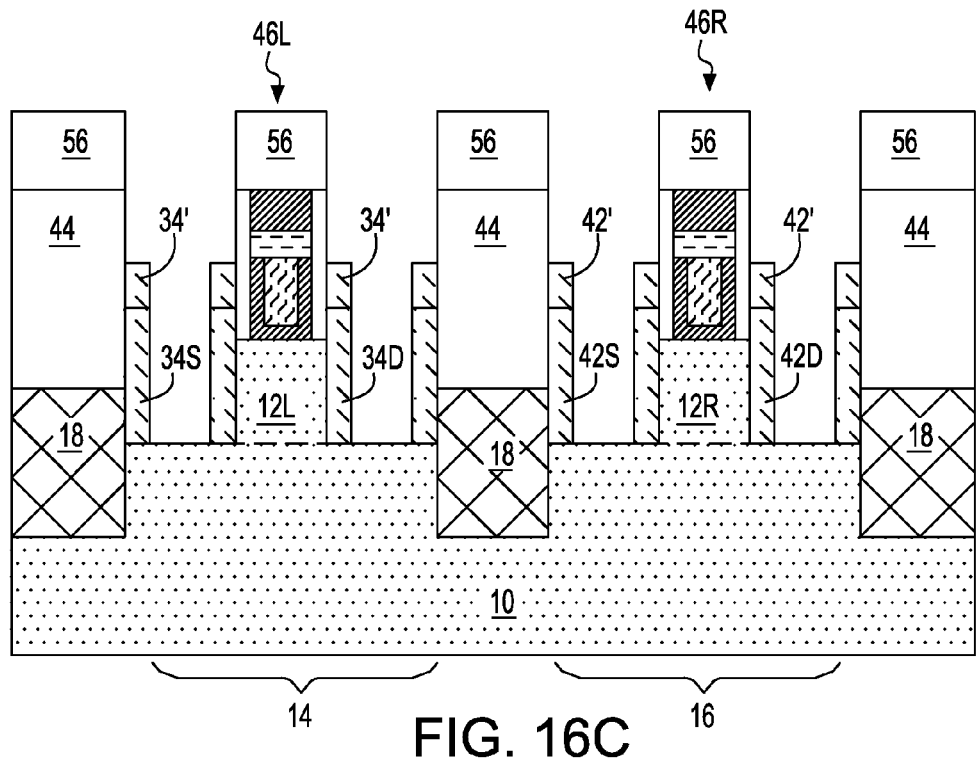
Figure 16D:
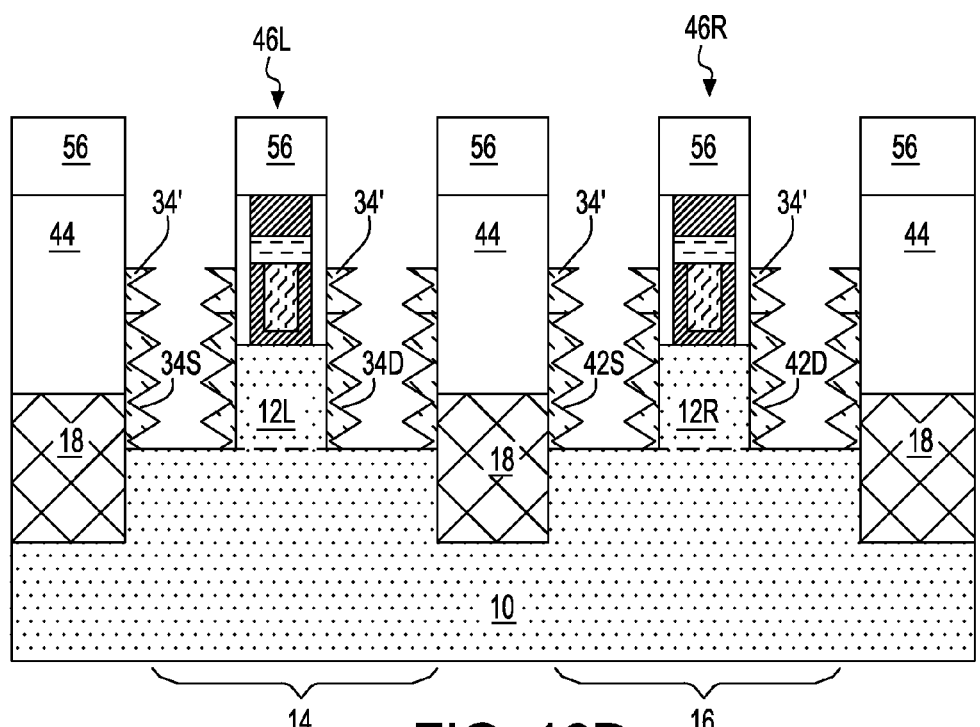

Referring now to FIGS. 16A, 16B, 16C and 16D, there are illustrated other alternative embodiments of the present invention in which the source and drain regions are made larger. These alternative embodiments can be formed into either the pFET device region or the nFET device region or both the pFET device region and the nFET device region. These alternative embodiments do not require the formation of the high k dielectric layer 36 mentioned above in the previous embodiments of the present invention. In these embodiments, the structure shown in FIGS. 11A-11B (minus high k dielectric layer 36 formation) is provided, and thereafter an additional epitaxial semiconductor material 34' is provided atop the first epitaxial semiconductor material that provides the source/drain regions 34S, 34D and an additional epitaxial semiconductor material 42' is provided onto the second epitaxial semiconductor material that provides the source/drain regions 42S, 42D by utilizing an epitaxial growth process. The additional epitaxial semiconductor material 34', 42' can then by patterned. In FIGS. 16A and 16C, the patterning can be achieved by lithography and etching. In FIG. 16B, the patterning can be achieved by a crystallographic wet etching process. In FIG. 16D, the patterning can be achieved by lithography and a crystallographic wet etch processes.

In FIGS. 16A and 16B, only the topmost surface of the additional epitaxial semiconductor material 34' and 42' is patterned. In FIGS. 16C and 16D, the additional epitaxial semiconductor material 34' and 42' and the underlying epitaxial semiconductor material (i.e., source/drain regions 34S, 34D, 42S and 42D) are patterned. Although the drawings illustrate patterning of the additional epitaxial semiconductor material 34' and 42' to have a same pattern, embodiments are contemplated in which different patterns can be provided into the additional epitaxial semiconductor material 34' and 42'.

Processing as described above as described above in FIGS. 12A-13D can be performed on any of the structure shown in FIGS. 16A, 16B, 16C and 16D.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, said method comprising:
    providing a structure comprising at least one first functional gate structure located on a first semiconductor material portion within a pFET device region of a semiconductor substrate and at least one second functional gate structure located on a second semiconductor material portion within an nFET device region of said semiconductor substrate, wherein a first epitaxial semiconductor material is located on each side of said at least one first functional gate structure and in contact with a surface of said first semiconductor material portion, and a second epitaxial semiconductor material is located on each side of said at least one second functional gate structure and in contact with a surface of said second semiconductor material portion, and wherein a surface of said first epitaxial semiconductor material includes a high k dielectric layer disposed thereon, and said first semiconductor material portion and second semiconductor material portion are both semiconductor fins;
    forming a layer of a dipole metal or a metal-insulator-semiconductor oxide on said second epitaxial semiconductor material, but not said first epitaxial semiconductor material;
    removing said high k dielectric layer from said surface of said first epitaxial semiconductor material; and
    forming a first metal semiconductor alloy on said first epitaxial semiconductor material and a second metal semiconductor alloy in direct contact with said layer of said dipole metal or said metal-insulator-semiconductor oxide.

2. The method of claim 1, further comprising forming an additional semiconductor material atop at least one of said first epitaxial semiconductor material and said second epitaxial semiconductor material and patterning said additional semiconductor material prior to forming said first and second metal semiconductor alloys.

3. The method of claim 1, further comprising performing an amorphizing ion implant prior to forming said first and second metal semiconductor alloys.

4. The method of claim 1, wherein said layer of dipole metal comprises a metal selected from the group consisting of Y, Er, Al, W, Ti, Hf, Zr, Zn, Be, La, Dy, Ye, Gd, Er, Yb and multilayers thereof.

5. The method of claim 1, wherein said layer of said metal-insulator-semiconductor oxide is selected from one of $SiO_xN_y$, $GeO_x$, $AlO_x$, $Ge_3N_4$, $TiO_2$, $HfO_2$, $ZrO_2$, $ZnO$, $Be_xO_y$, $La_xO_y$, $Dy_xO_y$, $Ye_xO_y$, $Gd_xO_y$, $Er_xO_y$, and $Yb_xO_y$, wherein x and y are a content of a fraction.

6. The method of claim 1, wherein said providing said structure comprises:
    providing a bulk semiconductor substrate;
    forming said first and second semiconductor material portions into a portion of said bulk semiconductor substrate by employing a sidewall image transfer process;
    forming at least one first sacrificial gate structure straddling said first semiconductor material portion and at least one second sacrificial gate structure straddling said second semiconductor material portion;
    forming a block mask over said second semiconductor material portion and atop each second sacrificial gate structure;
    recessing a portion of said first semiconductor material portion located on each side of said at least one first sacrificial gate structure;
    forming said first epitaxial semiconductor material by an epitaxial deposition process in each recessed portion of said first semiconductor material portion;
    forming said high k gate dielectric on a surface of said first semiconductor material portion and exposed surfaces of each first sacrificial gate structure;
    removing said block mask from said second epitaxial semiconductor material portion;
    forming another block mask over said first epitaxial semiconductor material portion;
    recessing a portion of said second semiconductor material portion located on each side of said at least one second sacrificial gate structure;
    forming said second epitaxial semiconductor material by an epitaxial deposition process in each recessed portion of said second semiconductor material portion; and
    removing said another block mask.

7. The method of claim 6, further comprising:
    forming a planarizing dielectric material surrounding said at least one first and second sacrificial gate structures;
    replacing said at least one first sacrificial gate structure with said at least one first functional gate structure and said at least one second sacrificial gate structure with said at least one second functional gate structure.

8. The method of claim 7, wherein said replacing said at least one first sacrificial gate structure with said at least one first functional gate structure and said at least one second sacrificial gate structure with said at least one second functional gate structure comprises:
forming a gate cavity by completely removing said first and said second sacrificial gate structures;
filling each gate cavity with a gate dielectric material portion and a gate conductor portion;
recessing said gate dielectric material portion and said gate conductor portion to provide a recessed area in said gate cavity; and
filling said recessed area in each gate cavity with a contact metal and a gate cap.

9. A method of forming a semiconductor structure, said method comprising
providing a structure comprising at least one first functional gate structure located on a first semiconductor material portion within a pFET device region of a semiconductor substrate and at least one second functional gate structure located on a second semiconductor material portion within an nFET device region of semiconductor substrate, wherein a first epitaxial semiconductor material is located on each side of said at least one first functional gate structure and in contact with a surface of said first semiconductor material portion, and a second epitaxial semiconductor material is located on each side of said at least one second functional gate structure and in contact with a surface of said second semiconductor material portion;
forming an additional semiconductor material atop at least one of said first epitaxial semiconductor material and said second epitaxial semiconductor material; and
patterning said additional semiconductor material.

10. The method of claim 9, wherein said patterning comprises lithography and etching a topmost portion of said additional semiconductor material.

11. The method of claim 9, wherein said patterning comprises a crystallographic wet etch of a topmost portion of said additional semiconductor material.

12. The method of claim 9, wherein said patterning comprises lithography and etching though said additional semiconductor material and through at least one of said first epitaxial semiconductor material portion and said second epitaxial semiconductor material portion.

13. The method of claim 9, wherein said patterning comprises a crystallographic wet etch though said additional semiconductor material and through at least one of said first epitaxial semiconductor material portion and said second epitaxial semiconductor material portion.

14. A method of forming a semiconductor structure, said method comprising:
providing a structure comprising at least one first functional gate structure located on a first semiconductor material portion within a pFET device region of a semiconductor substrate and at least one second functional gate structure located on a second semiconductor material portion within an nFET device region of said semiconductor substrate, wherein a first epitaxial semiconductor material is located on each side of said at least one first functional gate structure and in contact with a surface of said first semiconductor material portion, and a second epitaxial semiconductor material is located on each side of said at least one second functional gate structure and in contact with a surface of said second semiconductor material portion, and wherein a surface of said first epitaxial semiconductor material includes a high k dielectric layer disposed thereon;
forming a layer of a dipole metal or a metal-insulator-semiconductor oxide on said second epitaxial semiconductor material, but not said first epitaxial semiconductor material;
removing said high k dielectric layer from said surface of said first epitaxial semiconductor material; and
forming a first metal semiconductor alloy on said first epitaxial semiconductor material and a second metal semiconductor alloy in direct contact with said layer of said dipole metal or said metal-insulator-semiconductor oxide, wherein said providing said structure comprises:
providing a bulk semiconductor substrate;
forming said first and second semiconductor material portions into a portion of said bulk semiconductor substrate by employing a sidewall image transfer process;
forming at least one first sacrificial gate structure straddling said first semiconductor material portion and at least one second sacrificial gate structure straddling said second semiconductor material portion;
forming a block mask over said second semiconductor material portion and atop each second sacrificial gate structure;
recessing a portion of said first semiconductor material portion located on each side of said at least one first sacrificial gate structure;
forming a first epitaxial semiconductor material by an epitaxial deposition process in each recessed portion of said first semiconductor material portion;
forming a high k gate dielectric on a surface of said first semiconductor material portion and exposed surfaces of each first sacrificial gate structure;
removing said block mask from said second epitaxial semiconductor material portion;
forming another block mask over said first epitaxial semiconductor material portion;
recessing a portion of said second semiconductor material portion located on each side of said at least one second sacrificial gate structure;
forming a second epitaxial semiconductor material by an epitaxial deposition process in each recessed portion of said second semiconductor material portion; and
removing said another block mask.

* * * * *